United States Patent
Sim et al.

(10) Patent No.: US 12,336,334 B2
(45) Date of Patent: Jun. 17, 2025

(54) LIGHT EMITTING ELEMENT HAVING A SINGLE CRYSTAL INSULATING LAYER ON A SIDE SURFACE OF THE LIGHT EMITTING ELEMENT AND DISPLAY DEVICE INCLUDING THE SAME

(71) Applicant: Samsung Display Co., Ltd., Yongin-si (KR)

(72) Inventors: Young Chul Sim, Pyeongtaek-si (KR); Jin Wan Kim, Hwaseong-si (KR); Dong Uk Kim, Hwaseong-si (KR); Dong Kyun Seo, Asan-si (KR); Byung Ju Lee, Seoul (KR); Seung Geun Lee, Hwaseong-si (KR); Hyung Rae Cha, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 482 days.

(21) Appl. No.: 17/662,205

(22) Filed: May 5, 2022

(65) Prior Publication Data

US 2023/0066350 A1 Mar. 2, 2023

(30) Foreign Application Priority Data

Sep. 1, 2021 (KR) .................. 10-2021-0116304

(51) Int. Cl.
  *H10H 20/82* (2025.01)
  *H10H 20/818* (2025.01)
  *H10H 20/824* (2025.01)
(52) U.S. Cl.
  CPC ........ *H10H 20/824* (2025.01); *H10H 20/818* (2025.01)

(58) Field of Classification Search
  CPC ................................ H01L 33/18; H01L 33/30
  USPC ........................................................... 257/95
  See application file for complete search history.

(56) References Cited

U.S. PATENT DOCUMENTS

| | | | |
|---|---|---|---|
| 2016/0197232 A1 | 7/2016 | Bour et al. | |
| 2018/0175248 A1 | 6/2018 | Ahmed | |
| 2022/0231081 A1 | 7/2022 | Kim et al. | |
| 2022/0320381 A1 | 10/2022 | Yoo et al. | |

FOREIGN PATENT DOCUMENTS

| | | | | |
|---|---|---|---|---|
| CN | 112689903 A | * | 4/2021 | ........... H01L 27/156 |
| KR | 2011-0102630 A | | 9/2011 | |
| KR | 10-2020-0021014 A | | 2/2020 | |
| KR | 10-2021-0008206 A | | 1/2021 | |
| KR | 2021-0003991 A | | 1/2021 | |

(Continued)

OTHER PUBLICATIONS

International Search Report issued Dec. 2, 2022, for related PCT International Application No. PCT/KR2022/012486 (3 pages).

(Continued)

*Primary Examiner* — Phuc T Dang
(74) *Attorney, Agent, or Firm* — Womble Bond Dickinson (US) LLP

(57) ABSTRACT

A light emitting element may include: a light emitting element core including a first semiconductor layer, a second semiconductor layer, and a light emitting layer between the first semiconductor layer and the second semiconductor layer; and a single crystal insulating layer around a side surface of the light emitting element core.

26 Claims, 24 Drawing Sheets

(56) References Cited

FOREIGN PATENT DOCUMENTS

| WO | WO-2018002498 A1 | * | 1/2018 | ......... H01L 27/1446 |
| WO | 2020-239529 A1 | | 12/2020 | |
| WO | WO-2021054551 A | * | 3/2021 | ........... H01L 33/218 |

OTHER PUBLICATIONS

Written Opinion of the International Searching Authority issued Dec. 2, 2022, for related PCT International Application No. PCT/KR2022/012486 (5 pages).

Ganguly, Satyaki et al., "Presence and origin of interface charges at atomic-layer deposited $Al_2O_3$/III-nitride heterojunctions", Applied Physics Letters, 2011, pp. 1-4, vol. 99, American Institute of Physics; https://dx.doi.org/10.1063/1.3688450 (4 pages).

Xiao, Ming et al., "Novel 2000 V Normally-off MOS-HEMTs using AlN/GaN Superlattice Channel", IEEE Proceedings of the $31^{st}$ International Symposium on Power Semiconductor Devices & ICs, May 19-23, 2019, pp. 471-474 (4 pages).

Zhang, Yachao et al., "High-performance high electron mobility transistors with GaN/InGaN composite channel and superlattice back barrier", Applied Physics Letters, Aug. 13, 2019, pp. 1-6, vol. 115, AIP Publishing; https://doi.org/10.1063/1.5108080 (6 pages).

* cited by examiner

LIGHT EMITTING ELEMENT HAVING A SINGLE CRYSTAL INSULATING LAYER ON A SIDE SURFACE OF THE LIGHT EMITTING ELEMENT AND DISPLAY DEVICE INCLUDING THE SAME

CROSS-REFERENCE TO RELATED APPLICATION

This application claims priority to and the benefit of Korean Patent Application No. 10-2021-0116304 filed on Sep. 1, 2021 in the Korean Intellectual Property Office, the entire content of which is incorporated herein by reference.

BACKGROUND

1. Field

One or more embodiments of the present disclosure relate to a light emitting element and a display device including the same.

2. Description of the Related Art

The importance of display devices has increased with the development of multimedia. Accordingly, various display devices such as an organic light emitting display (OLED) and a liquid crystal display (LCD) have been widely utilized.

The display devices are devices for displaying images, and include display panels such as organic light emitting display panels and/or liquid crystal display panels. The display panel may include light emitting elements, which may be light emitting diodes (LEDs). Examples of the light emitting diode include an organic light emitting diode (OLED) that utilizes an organic material as a light emitting material, an inorganic light emitting diode that utilizes an inorganic material as a light emitting material, and the like.

SUMMARY

One or more aspects of embodiments of the present disclosure provide a light emitting element having improved element efficiency and reliability by forming a first element insulating layer, which is a single crystal insulating layer, between a side surface of a light emitting element core and a second element insulating layer, in order to improve surface defects of the light emitting element core including a plurality of semiconductor layers and physically separate internal defects of the second element insulating layer and the light emitting element core from each other.

One or more aspects of embodiments of the present disclosure also provide a light emitting element having improved element efficiency and reliability by forming a first element insulating layer having a superlattice structure in which first layers and second layers that are heterogeneous are alternately stacked, between a side surface of a light emitting element core and a second element insulating layer, in order to improve surface defects of the light emitting element core including a plurality of semiconductor layers and prevent or reduce the diffusion of impurities from the second element insulating layer to the light emitting element core.

One or more aspects of embodiments of the present disclosure also provide a display device having an improved display quality by including a light emitting element including a first element insulating layer, which is a single crystal insulating layer, or a light emitting element including a first element insulating layer having a superlattice structure.

However, aspects of embodiments of the present disclosure are not restricted to those set forth herein. The above and other aspects of the disclosure will become more apparent to one of ordinary skill in the art to which the disclosure pertains by referencing the detailed description of the disclosure given below.

According to one or more embodiments of the disclosure, a light emitting element may include: a light emitting element core including a first semiconductor layer, a second semiconductor layer, and a light emitting layer between the first semiconductor layer and the second semiconductor layer; and a single crystal insulating layer surrounding (e.g., on) a side surface of the light emitting element core.

The light emitting element may further comprise an element insulating layer on (e.g., surrounding) an outer surface of the single crystal insulating layer.

The element insulating layer may include a first element insulating film on (e.g., surrounding) the outer surface of the single crystal insulating layer and a second element insulating film on (e.g., surrounding) an outer surface of the first element insulating film.

The single crystal insulating layer may have a superlattice structure in which first layers and second layers including different materials are alternately stacked, and the first layers and the second layers may be stacked in a direction substantially perpendicular (e.g., perpendicular) to the side surface of the light emitting element core.

Each of the first layers and the second layers may be a single crystal insulating film.

Each of the first layers and the second layers may have a thickness equal to or less than a critical thickness.

A first layer of the first layers may include a first compound semiconductor, and a second layer of the second layers may include a second compound semiconductor different from the first compound semiconductor.

Each of the first compound semiconductor and the second compound semiconductor may include a group III-V semiconductor compound.

The first compound semiconductor may have a chemical formula of AB (where A is a group III element and B is a group V element), and the second compound semiconductor may have a chemical formula of $A_xC_{1-x}B$ (where $0 \leq x < 1$, A and C are group III elements, and B is a group V element).

Each of the first layer and the second layer may have a thickness greater than 0 and equal to or less than 5 nm.

The single crystal insulating layer may be directly on the side surface of the light emitting element core, and the side surface of the light emitting element core may include at least one of a side surface of the first semiconductor layer, a side surface of the second semiconductor layer, or a side surface of the light emitting layer.

According to one or more embodiments of the disclosure, a light emitting element may include: a light emitting element core including a first semiconductor layer, a second semiconductor layer, and a light emitting layer between the first semiconductor layer and the second semiconductor layer, and a first element insulating layer on (e.g., surrounding) a side surface of the light emitting element core, wherein the first element insulating layer has a superlattice structure in which first layers including a first compound semiconductor and second layers including a second compound semiconductor different from the first compound semiconductor are alternately stacked.

Each of the first compound semiconductor and the second compound semiconductor may include a group III-V semiconductor compound.

The first compound semiconductor may have a chemical formula of AB (where A is a group III element and B is a group V element), and the second compound semiconductor may have a chemical formula of $A_xC_{1-x}B$ (where 0≤x<1, A and C are group III elements, and B is a group V element).

Each of the first layers and the second layers may be a single crystal layer.

Each of the first layers and the second layers may have a thickness greater than 0 and equal to or less than 5 nm.

The light emitting element may further comprise a second element insulating layer on (e.g., surrounding) the first element insulating layer.

The second element insulating layer may include a first element insulating film on (e.g., surrounding) an outer surface of the first element insulating layer and a second element insulating film on (e.g., surrounding) an outer surface of the first element insulating film.

The light emitting element may further include a first element insulating film on (e.g., surrounding) the side surface of the light emitting element core; and a second element insulating film on (e.g., surrounding) an outer surface of the first element insulating layer, wherein the first element insulating layer may be between the first element insulating film and the second element insulating film.

According to one or more embodiments of the disclosure, a display device may include: a first electrode and a second electrode to be spaced apart from each other on a substrate; and a light emitting element between the first electrode and the second electrode, wherein the light emitting element includes: a light emitting element core including a first semiconductor layer, a second semiconductor layer, and a light emitting layer between the first semiconductor layer and the second semiconductor layer; and a single crystal insulating layer on (e.g., surrounding) a side surface of the light emitting element core.

The single crystal insulating layer may have a superlattice structure in which first layers and second layers including different materials are alternately stacked, and the first layers and the second layers may be stacked in a direction substantially perpendicular (e.g., perpendicular) to the side surface of the light emitting element core.

The first layer may include a first compound semiconductor, and the second layer may include a second compound semiconductor different from the first compound semiconductor.

Each of the first layers and the second layers may be a single crystal insulating film.

According to one or more embodiments of the disclosure, a display device may include: a first electrode and a second electrode on a substrate and spaced apart from each other; and a light emitting element between the first electrode and the second electrode, wherein the light emitting element includes: a light emitting element core including a first semiconductor layer, a second semiconductor layer, and a light emitting layer between the first semiconductor layer and the second semiconductor layer; and a first element insulating layer on (e.g., surrounding) a side surface of the light emitting element core, the first element insulating layer has a superlattice structure in which first layers including a first compound semiconductor and second layers including a second compound semiconductor different from the first compound semiconductor are alternately stacked.

Each of the first compound semiconductor and the second compound semiconductor may include a group III-V semiconductor compound.

First compound semiconductor may have a chemical formula of AB (where A is a group III element and B is a group V element), and the second compound semiconductor may have a chemical formula of $A_xC_{1-x}B$ (where 0≤x<1, A and C are group III elements, and B is a group V element).

Each of the first layers and the second layers may be a single crystal layer.

Further details of other embodiments are described in a detailed description and are illustrated in the drawings.

The light emitting element according to one or more embodiments may include a light emitting element core including a plurality of semiconductor layers and a first element insulating layer on (e.g., surrounding) a side surface (or an outer circumferential layer) of the light emitting element core. The first element insulating layer may be directly on the side surface of the light emitting element core, and may be a single crystal insulating layer including an insulating material having a single crystal structure. When the first element insulating layer is the single crystal insulating layer, the single crystal insulating layer may be directly on a surface (side surface) of the light emitting element core, such that the surface of the light emitting element core may have a surface-treated effect, and accordingly, surface defects of the light emitting element core may be improved.

In addition, when the light emitting element further includes a second element insulating layer on an outer surface of the first element insulating layer, the first element insulating layer may be between the light emitting element core and the second element insulating layer to physically separate the light emitting element core from internal defects of the second element insulating layer and prevent or reduce the diffusion of impurities from the second element insulating layer to the plurality of semiconductor layers of the light emitting element core, such that element efficiency and reliability of the light emitting element may be improved.

The light emitting element according to one or more other embodiments may include a light emitting element core including a plurality of semiconductor layers and a first element insulating layer on (e.g., surrounding) a side surface (or an outer circumferential surface) of the light emitting element core and having a superlattice structure in which first layers and second layers that are heterogeneous are alternately stacked. Each of the first layers and the second layers may be a single crystal insulating film. In this case, each of the first and second layers may be formed to have a thickness equal to or less than a critical thickness so as to maintain a single crystal structure, and the first element insulating layer may have a structure in which single crystal insulating films are stacked as a plurality of layers, and may thus be formed to have a great (e.g., a suitable) thickness. Accordingly, insulating properties of the first element insulating layer and a barrier role of the first element insulating layer in preventing or reducing the diffusion of impurities may be improved, and thus, reliability of the light emitting element may be improved.

In addition, when at least one of the plurality of semiconductor layers of the light emitting element core includes group III and group V semiconductor materials, each of the first layers and the second layers included in the first element insulating layer may be a compound semiconductor layer including a group III-V semiconductor compound. Accordingly, a difference in lattice constant between a material included in the semiconductor layers of the light emitting element core and the first layer and the second layer may be minimized or reduced, and the first element insulating layer having a high quality may be included, such that element efficiency and reliability of the light emitting element may be improved.

One or more aspects of embodiments of the present disclosure also provide a display device having an improved display quality by including a light emitting element including a first element insulating layer, which is a single crystal insulating layer, or a light emitting element including a first element insulating layer having a superlattice structure.

The display device according to one or more embodiments may include the light emitting element having improved element efficiency and reliability to have an improved display quality.

The effects of the disclosure are not limited to the aforementioned effects, and various other effects are included in the specification.

BRIEF DESCRIPTION OF THE DRAWINGS

The above and other aspects and features of the disclosure will become more apparent by describing in more detail embodiments thereof with reference to the attached drawings, in which.

DETAILED DESCRIPTION

Figure 1:
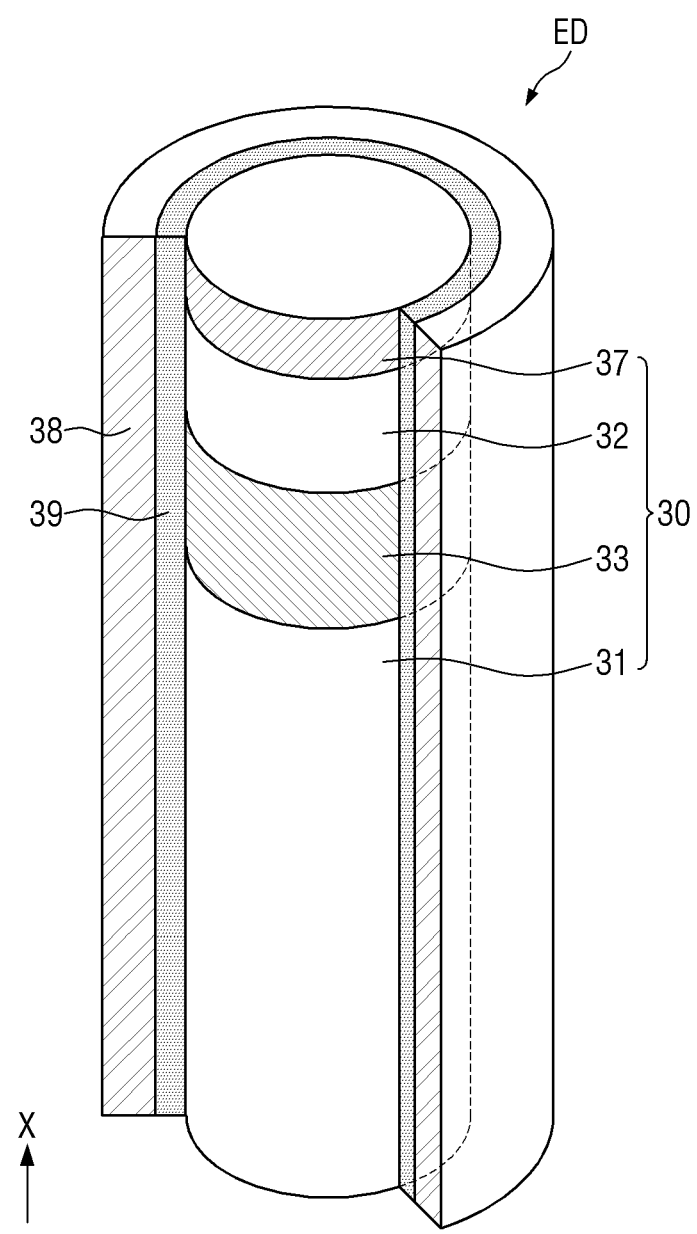
FIG. 1 is a schematic perspective view of a light emitting element according to one or more embodiments.

The present disclosure will now be described more fully hereinafter with reference to the accompanying drawings, in which embodiments of the present disclosure are shown. This present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate (e.g., without intervening layers therebetween), or intervening layers may also be present. The same reference numbers indicate the same components throughout the specification.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

As used herein, expressions such as "at least one of", "one of", and "selected from", when preceding a list of elements, modify the entire list of elements and do not modify the individual elements of the list. For example, "at least one of a, b and c", "at least one of a, b or c", and "at least one of a, b and/or c" may indicate only a, only b, only c, both (e.g., simultaneously) a and b, both (e.g., simultaneously) a and c, both (e.g., simultaneously) b and c, all of a, b, and c, or variations thereof.

As used herein, the term "and/or" includes any and all combinations of one or more of the associated listed items. Further, the use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinafter, embodiments will be described with reference to the accompanying drawings.

Figure 2:
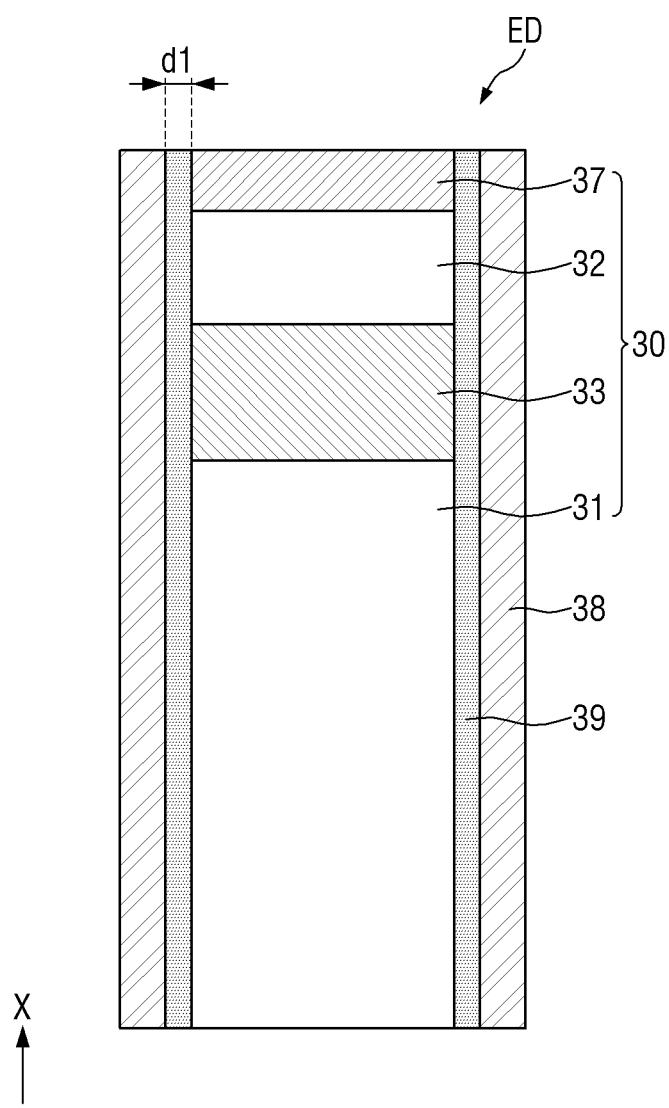
FIG. 2 is a cross-sectional view of the light emitting element according to one or more embodiments.

FIG. 1 is a schematic perspective view of a light emitting element according to one or more embodiments. FIG. 2 is a cross-sectional view of the light emitting element according to one or more embodiments.

Referring to FIGS. 1 and 2, a light emitting element ED is a particle type element (e.g., a particle element), and may have a rod shape and/or a cylindrical shape having a set or predetermined aspect ratio. The light emitting element ED may have a shape extending in one direction X, a length of the light emitting element ED in an extension direction (or a length direction X) may be greater than a diameter of the light emitting element ED, and the aspect ratio of the light emitting element ED may be 1.2:1 to 100:1, but the disclosure is not limited thereto. For example, the light emitting element ED may have a shape such as a cylindrical shape, a rod shape, a wire shape, and/or a tube shape, or may have a polygonal prismatic shape such as a cubic shape, a rectangular parallelepiped shape, and/or a hexagonal prismatic shape, or may have a shape extending in one direction and having a partially inclined outer surface. Hereinafter, in the drawings for describing a shape of the light emitting element ED, the terms "one direction X, "extension direction X of the light emitting element ED", and "length direction X of the light emitting element ED" may be used interchangeably.

The light emitting element ED may have a size of a nanometer scale (e.g., 1 nm or more and less than 1 μm) to a micrometer scale (e.g., 1 μm or more and less than 1 mm). In one or more embodiments, the light emitting element ED may have a size of a nanometer scale or have a size of a micrometer scale, in both the length and the diameter. In some other embodiments, the diameter of the light emitting element ED may have a size of a nanometer scale, while the length of the light emitting element ED may have a size of a micrometer scale. In embodiments, some of the light emitting elements ED have sizes of a nanometer scale in diameter and/or length, while other light emitting elements ED may have a size of a micrometer scale in diameter and/or length.

In one or more embodiments, the light emitting element ED may be an inorganic light emitting diode. The inorganic light emitting diode may include a plurality of semiconductor layers. For example, the inorganic light emitting diode may include a first conductivity-type (e.g., n-type) semiconductor layer, a second conductivity-type (e.g., p-type) semiconductor layer, and an active semiconductor layer interposed between the first conductivity-type semiconductor layer and the second conductivity-type semiconductor layer. The active semiconductor layer may receive holes and electrons provided from the first conductivity-type semiconductor layer and the second conductivity-type semiconductor layer, respectively, and the holes and the electrons reaching the active semiconductor layer may be combined with each other to emit light. In addition, the inorganic light emitting diode may be aligned between two electrodes in which polarities are formed when an electric field is formed in a set or specific direction between the two electrodes facing each other.

The light emitting element ED may include a light emitting element core 30, a first element insulating layer 39, and a second element insulating layer 38.

The light emitting element core 30 may have a shape extending in one direction X. The light emitting element core 30 may have a rod and/or cylindrical shape. However, the disclosure is not limited thereto, and the light emitting element core 30 may have a polygonal prismatic shape such as a cubic shape, a rectangular parallelepiped shape, and/or a hexagonal prismatic shape, or have a shape extending in one direction X and having a partially inclined outer surface.

The light emitting element core 30 may include a first semiconductor layer 31, a second semiconductor layer 32, a light emitting layer 33, and an element electrode layer 37. The first semiconductor layer 31, the light emitting layer 33, the second semiconductor layer 32, and the element electrode layer 37 may be sequentially stacked along one direction X, which is the length direction of the light emitting element core 30.

The first semiconductor layer 31 may be doped with a first conductivity-type dopant. The first conductivity-type may be an n-type, and the first conductivity-type dopant may be Si, Ge, Sn, and/or the like. For example, the first semiconductor layer 31 may be an n-type semiconductor. In one or more embodiments, the first semiconductor layer 31 may be made of n-GaN doped with n-type Si.

The second semiconductor layer 32 may be spaced apart from the first semiconductor layer 31 with the light emitting layer 33 interposed therebetween. The second semiconductor layer 32 may be doped with a second conductivity-type dopant. The second conductivity-type may be a p-type, and the second conductivity-type dopant may be Mg, Zn, Ca, Sr, Ba, and/or the like. For example, the second semiconductor layer 32 may be a p-type semiconductor. In one or more embodiments, the second semiconductor layer 32 may be made of p-GaN doped with p-type Mg.

While it has been illustrated in FIGS. 1 and 2 that each of the first semiconductor layer 31 and the second semiconductor layer 32 is configured as one layer, the disclosure is not limited thereto. Each of the first semiconductor layer 31 and the second semiconductor layer 32 may further include a larger number of layers, for example, a clad layer and/or a tensile strain barrier reducing (TSBR) layer, depending on a material included in the light emitting layer 33.

The light emitting layer 33 may be between the first semiconductor layer 31 and the second semiconductor layer 32. The light emitting layer 33 may include a material having a single or multiple quantum well structure. The light emitting layer 33 may emit light by a combination of electron-hole pairs according to an electrical signal applied through the first semiconductor layer 31 and the second semiconductor layer 32. For example when the light emitting layer 33 is configured to emit light of a blue wavelength band, the light emitting layer 33 may include a material such as AlGaN and/or AlGaInN, but is not limited thereto.

In some embodiments, the light emitting layer 33 may have a structure in which semiconductor materials having large band gap energy and semiconductor materials having small band gap energy are alternately stacked, and may include other Group III to Group V semiconductor materials, depending on a wavelength band of emitted light. The light emitted by the light emitting layer 36 is not limited to the light of the blue wavelength band, and in some embodiments, the light emitting layer 36 may emit light of a red and/or green wavelength band.

The light emitted from the light emitting layer 33 may be emitted not only toward both end surfaces of the light emitting element ED along the one direction X, which is the length direction of the light emitting element ED, but also toward a side surface of the light emitting element ED. An emission direction of the light emitted from the light emitting layer 33 is not limited to one direction.

The element electrode layer 37 may be between the second semiconductor layer 32 and an electrode, and may serve to reduce resistance when both ends of the light emitting element ED and electrodes are electrically connected (e.g., electrically coupled) to each other in order to apply electrical signals to the first semiconductor layer 31 and the second semiconductor layer 32. The element electrode layer 37 may include at least one of aluminum (Al), titanium (Ti), indium (In), gold (Au), silver (Ag), indium tin oxide (ITO), indium zinc oxide (IZO), or indium tin zinc oxide (ITZO). The element electrode layer 37 may also include an n-type or p-type doped semiconductor material. While it has been illustrated in FIGS. 1 and 2 that the element electrode layer 37 is on the second semiconductor layer 32, the disclosure is not limited thereto. For example, an element electrode layer 37 may also be further on the first semiconductor layer 31 to be between the first semiconductor layer 31 and the electrode.

The first element insulating layer 39 may surround a side surface (or an outer circumferential surface) of the light emitting element core 30. The first element insulating layer 39 may surround side surfaces of a plurality of semiconductor layers and/or the element electrode layer included in the light emitting element core 30. The first element insulating layer 39 may surround at least side surfaces of the first semiconductor layer 31, the light emitting layer 33, and the second semiconductor layer 32, and may extend in one direction X in which the light emitting element core 30 extends.

The first element insulating layer 39 may surround the side surface of the light emitting element core 30 but may expose both end surfaces of the light emitting element core 30. The first element insulating layer 39 is not positioned on either end surface of the light emitting element core 30 (upper and lower surfaces of the light emitting element core 30 in FIG. 1), such that the element electrode layer 37 and the first semiconductor layer 31 of the light emitting element core 30 may be at least partially exposed by the first element insulating layer 39.

In one or more embodiments, the first element insulating layer 39 may include an insulating material having a single crystal structure. For example, the first element insulating layer 39 may be a single crystal insulating layer 39. Hereinafter, in the specification, for convenience of explanation, the terms "first element insulating layer 39" and "single crystal insulating layer 39" may be used interchangeably with respect to the same reference numeral '39'.

The first element insulating layer 39 may include an insulating material having a single crystal structure, and the insulating material included in the first element insulating layer 39 may be a material having a higher permittivity than a material included in the plurality of semiconductor layers of the light emitting element core 30. For example, a dielectric constant of the material included in the first element insulating layer 39 may be greater than a dielectric constant of the material included in the plurality of semiconductor layers of the light emitting element core 30. Because the first element insulating layer 39 includes the insulating material having the single crystal structure and having a higher dielectric constant than the material included in the plurality of semiconductor layers, the first element insulating layer 39 may serve to improve surface defects of a plurality of semiconductor layers included in a light emitting element core 30 to be described in more detail herein below.

In one or more embodiments in which the first semiconductor layer 31, the second semiconductor layer 32, and the light emitting layer 33 include GaN, the first element insulating layer 39 may include a single crystal insulating material having a dielectric constant greater than that of GaN. In one or more embodiments, the first element insulating layer 39 may include aluminum nitride (AlN) having a single crystal structure, aluminum oxide ($Al_xO_y$) having a single crystal structure, and/or the like.

The first element insulating layer 39 may be directly on the side surface of the light emitting element core 30. The first element insulating layer 39 may be in direct contact with the side surface of the light emitting element core 30. Accordingly, an inner surface of the first element insulating layer 39 may be in contact with the side surface of the light emitting element core 30. Because the first element insulating layer 39 includes the insulating material having the single crystal structure and is directly formed on the side surface of the light emitting element core 30, the first element insulating layer 39 may surface-treat the side surfaces of the first semiconductor layer 31, the second semiconductor layer 32, and the light emitting layer 33 of the light emitting element core 30 to improve surface defects formed on the side surfaces of the plurality of semiconductor layers of the light emitting element core 30. The surface defects formed on the side surface of the light emitting element core 30 may be detects occurring on surfaces of the semiconductor layers exposed to the outermost portion in an etching process for forming the light emitting element core 30 among processes of manufacturing the light emitting element ED as described in more detail herein below.

In one or more embodiments, the first element insulating layer 39 may be interposed between the light emitting element core 30 and the second element insulating layer 38 and may serve to prevent or reduce defects formed inside the second element insulating layer 38, and/or prevent or reduce the diffusion of impurities from the second element insulating layer 38 to the plurality of semiconductor layers (e.g., the first semiconductor layer 31, the second semiconductor layer 32, and the light emitting layer 33) of the light emitting element core 30. For example, the first element insulating layer 39 may be interposed between the light emitting element core 30 and the second element insulating layer 38, and may serve to physically separate the light emitting element core 30 and the second element insulating layer 38 from each other.

The first element insulating layer 39 may have a set or predetermined thickness d1, and may be formed on the side surface of the light emitting element core 30. The first element insulating layer 39 formed on the side surface of the light emitting element core 30 may be formed by forming a first insulating material layer 390 having a single crystal structure on the side surface (or the outer circumferential surface) of the light emitting element core 30 and then removing a portion of the first insulating material layer 390, as described in more detail herein below.

Meanwhile, in order for the first element insulating layer 39 formed on the side surface of the light emitting element core 30 to maintain the single crystal structure, the first element insulating layer 39 should be formed to have the thickness d1 equal to or less than a critical thickness. In the specification, the 'critical thickness' may be defined as a thickness at which a thin film maintains a single crystal structure in a process of forming the thin film. In one or more embodiments, the thickness d1 of the first element insulating layer 39 may be in a range equal to or less than a critical thickness of a material included in the first element insulating layer 39. For example, when the first element insulating layer 39 includes aluminum nitride (AlN) having a single crystal structure, the thickness d1 of the first element insulating layer 39 may be in the range of 5 nm or less. In this case, the first element insulating layer 39 may be formed to maintain the single crystal structure.

The second element insulating layer 38 may be provided on an outer surface (or an outer circumferential surface) of the first element insulating layer 39. The second element insulating layer 38 may surround the outer surface (or an outer circumferential surface) of the first element insulating layer 39.

The second element insulating layer 38 may surround the outer surface (or an outer circumferential surface) of the first element insulating layer 39, and may extend in one direction X. The second element insulating layer 38 may cover the side surface of the light emitting element core 30 but may expose both end surfaces of the light emitting element core 30, similar to the first element insulating layer 39. It has been illustrated in FIGS. 1 and 2 that the second element insulating layer 38 is formed to extend in the length direction X of the light emitting element ED to cover the side surfaces of the first semiconductor layer 31 to the element electrode layer 37, but the disclosure is not limited thereto. For example, the second element insulating layer 38 may cover only the side surface of some of the semiconductor layers including the light emitting layer 33, or may cover a partial area of the side surface of the element electrode layer 37, but expose the other partial area of the side surface of the element electrode layer 37.

The second element insulating layer 38 may serve to protect the first semiconductor layer 31, the second semiconductor layer 32, and the light emitting layer 33 of the light emitting element core 30. The second element insulating layer 38 may prevent or reduce the risk of an electrical short circuit that may occur when the light emitting layer 33 is in direct contact with an electrode through which an electrical signal is transferred to the light emitting element ED.

The second element insulating layer 38 may include a material having insulation properties. For example, the second element insulating layer 38 may include silicon oxide ($SiO_x$), silicon nitride ($SiN_x$), silicon oxynitride ($SiO_xN_y$), aluminum nitride (AlN), aluminum oxide ($Al_xO_y$), titanium oxide ($TiO_x$), zirconium oxide ($ZrO_x$), hafnium oxide ($HfO_x$), and/or the like.

The light emitting element ED according to one or more embodiments may include the first element insulating layer (or the single crystal insulating layer) 39 surrounding (e.g., around) the side surface of the light emitting element core 30 including the plurality of semiconductor layers, and the first element insulating layer 39 may include the insulating material having the single crystal structure. Because the single crystal insulating layer 39 has the single crystal structure and is provided to form a physical interface between the second element insulating layer 38 and the semiconductor layers of the light emitting element core 30, the single crystal insulating layer 39 may prevent or reduce the diffusion of impurities from the second element insulating layer 38 to the plurality of semiconductor layers of the light emitting element core 30 and may physically separate internal defects of the second element insulating layer 38 and the plurality of semiconductor layers of the light emitting element core 30 from each other.

According to one or more embodiments, in the etching process for forming the light emitting element core 30 among the processes (e.g., acts) of manufacturing the light emitting element ED, defects of a semiconductor material may occur on the surfaces of the plurality of semiconductor layers of the light emitting element core 30 exposed to an etchant at the outermost portion thereof. The surface defects formed on the side surfaces of the plurality of semiconductor layers of the light emitting element core 30 may cause leakage of electrons injected into the semiconductor layers and/or trapping of holes injected into the semiconductor layers, and may hinder a combination of the electrons and the holes, resulting in a decrease in light efficiency of the light emitting element ED.

In the light emitting element ED according to the embodiments, the first element insulating layer 39 may have the single crystal structure and be directly on the side surface of the light emitting element core 30 on which the surface defects may occur during the processes (e.g., acts) of manufacturing the light emitting element ED. Accordingly, the side surface of the light emitting element core 30 may have a surface-treated effect by (e.g., due to) the first element insulating layer 39. For example, the single crystal insulating layer 39 is formed on the side surfaces of the plurality of semiconductor layers of the light emitting element core 30, such that a dislocation density on the surface of the light emitting element core 30 may be decreased. Accordingly, element efficiency and reliability of the light emitting element ED may be improved by improving the surface defects formed on the side surface of the light emitting element core 30 by the first element insulating layer 39.

In one or more embodiments, the first element insulating layer 39 may be formed to have the thickness equal to or less than the critical thickness of the material included in the first element insulating layer 39. Accordingly, the first element insulating layer 39 may be formed as the single crystal insulating layer 39 in which single crystallinity is excellently or suitably maintained. Accordingly, the first element insulating layer 39, which is the single crystal insulating layer 39, may further improve the surface defects of the light emitting element core 30 and may increase an effect of preventing or reducing the diffusion of impurities from the second element insulating layer 38 and/or the outside to the plurality of semiconductor layers of the light emitting element core 30.

Figure 3:
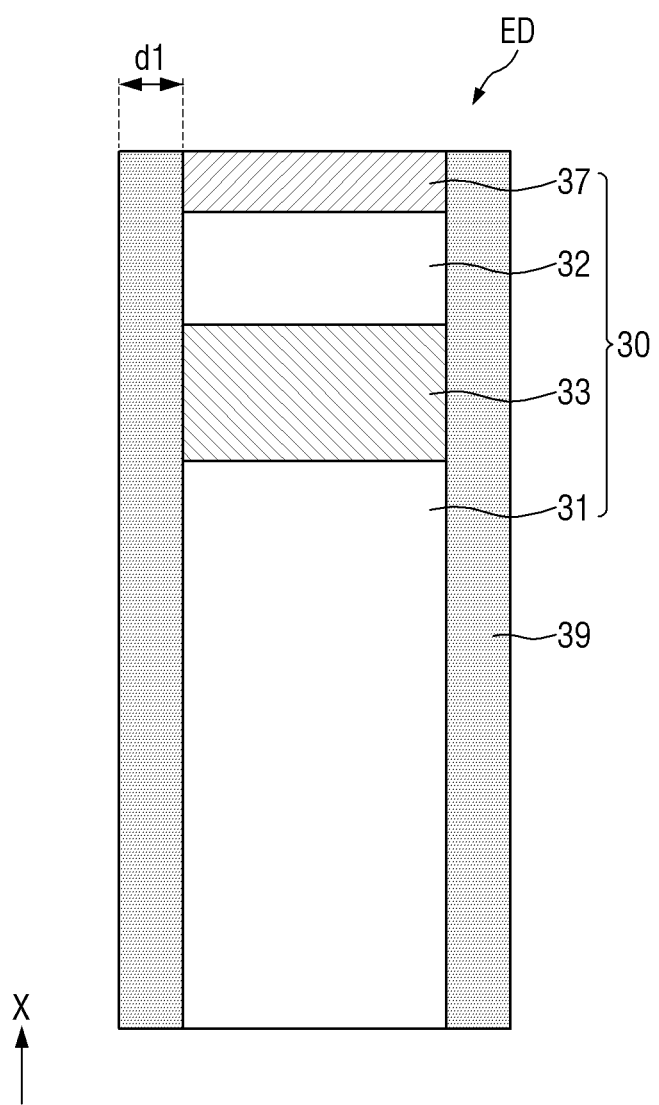
FIG. 3 is a cross-sectional view of a light emitting element according to one or more other embodiments.

FIG. 3 is a cross-sectional view of a light emitting element according to one or more other embodiments.

Referring to FIG. 3, a light emitting element ED according to the embodiments is different from the light emitting element according to the one or more embodiments of FIG. 2 in that the second element insulating layer 38 is not provided.

In the embodiments in which the second element insulating layer 38 is not provided, a thickness of the first element insulating layer 39 may not be limited (e.g., may be any suitable thickness) in order for the first element insulating layer 39 to protect the plurality of semiconductor layers of the light emitting element core 30. The thickness of the first element insulating layer 39 may be in the range of 2 nm to 5 nm (or 2 nm to less than 5 nm), but is not limited thereto. The thickness of the first element insulating layer 39 may be suitably changed depending on a method of forming the first element insulating layer 39.

Figure 4:
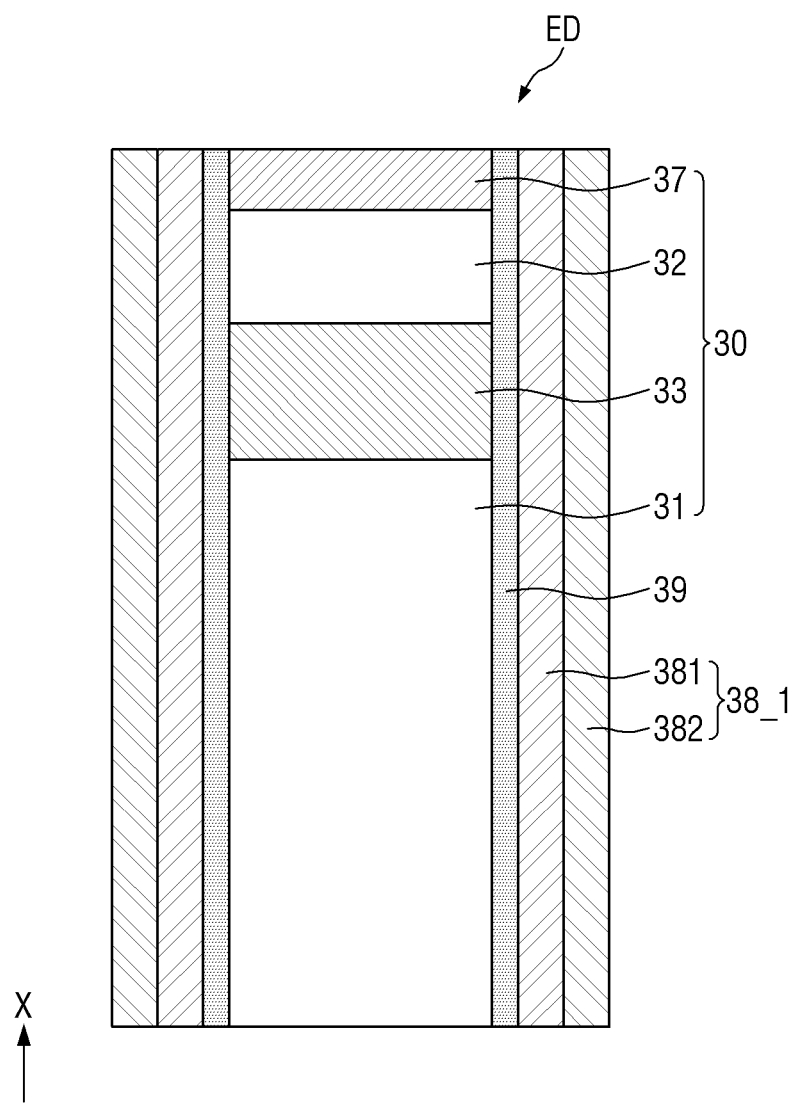
FIG. 4 is a cross-sectional view of a light emitting element according to one or more other embodiments.

FIG. 4 is a cross-sectional view of a light emitting element according to one or more other embodiments.

Referring to FIG. 4, a light emitting element ED according to the embodiments is different from the light emitting element according to one or more embodiments of FIG. 2 in that a second element insulating layer 38_1 includes a plurality of element insulating films.

For example, the second element insulating layer 38_1 may include a first element insulating film 381 and a second element insulating film 382.

The first element insulating film 381 may be provided on an outer surface (or an outer circumferential surface) of the first element insulating layer 39. The first element insulating film 381 may surround the outer surface (or an outer circumferential surface) of the first element insulating layer 39. A structure and a material included in the first element insulating film 381 may be substantially the same as the structure and the material of the second element insulating layer 38 described above. For example, the first element insulating film 381 may include silicon oxide ($SiO_x$), silicon nitride ($SiN_x$), silicon oxynitride ($SiO_xN_y$), aluminum nitride (AlN), aluminum oxide ($Al_xO_y$), titanium oxide ($TiO_x$), zirconium oxide ($ZrO_x$), hafnium oxide ($HfO_x$), and/or the like.

The second element insulating film 382 may be provided on an outer surface (or an outer circumferential surface) of the first element insulating film 381. The second element insulating film 382 may surround the outer surface (or an outer circumferential surface) of the first element insulating film 381, and may extend in one direction X. The second element insulating film 382 may cover the side surface of the light emitting element core 30 but may expose both end surfaces of the light emitting element core 30, similar to the first element insulating film 381. It has been illustrated in FIG. 4 that the second element insulating film 382 is formed to extend in the length direction X of the light emitting element ED to cover the side surfaces of the first semiconductor layer 31 to the element electrode layer 37, but the disclosure is not limited thereto.

The second element insulating film 382 may serve to protect the first element insulating film 381. For example, the second element insulating film 382 may surround the outer surface (or an outer circumferential surface) of the first element insulating film 381 and may serve to prevent or reduce the damage to the first element insulating film 381 or the light emitting element core 30 in a process of forming a second insulating layer 520 (see FIG. 20) and/or another member of a display device 10 (see FIG. 18) among processes (e.g., acts) of manufacturing the display device 10.

The second element insulating film 382 may include, for example, silicon oxide ($SiO_x$), silicon nitride ($SiN_x$), silicon oxynitride ($SiO_xN_y$), aluminum nitride (AlN), aluminum oxide ($Al_xO_y$), titanium oxide ($TiO_x$), zirconium oxide ($ZrO_x$), hafnium oxide ($HfO_x$), and/or the like.

It has been illustrated in FIG. 4 that the second element insulating film 382 may completely (e.g., entirely) cover the outer surface (or an outer circumferential surface) of the first element insulating film 381, but the disclosure is not limited thereto. For example, the second element insulating film 382 may also expose a portion of the outer surface (or an outer circumferential surface) of the first element insulating film 381 at one end of the light emitting element ED at which the element electrode layer 37 is positioned.

Figure 5:
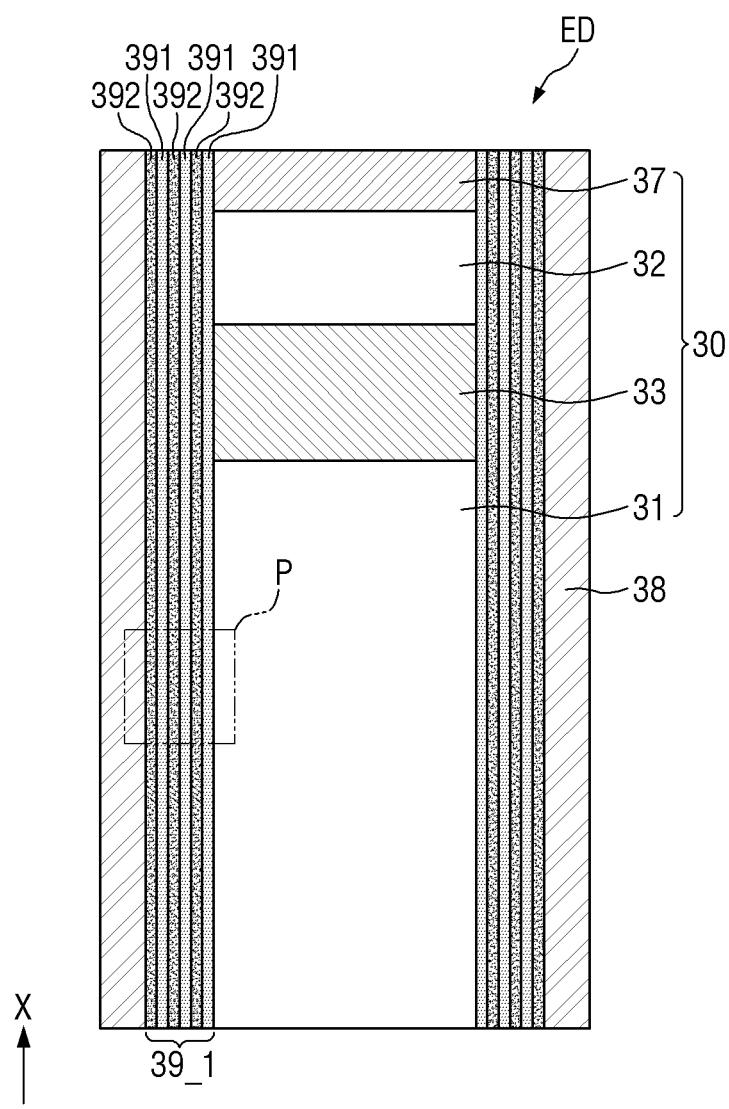
FIG. 5 is a cross-sectional view of a light emitting element according to one or more other embodiments.
Figure 6:
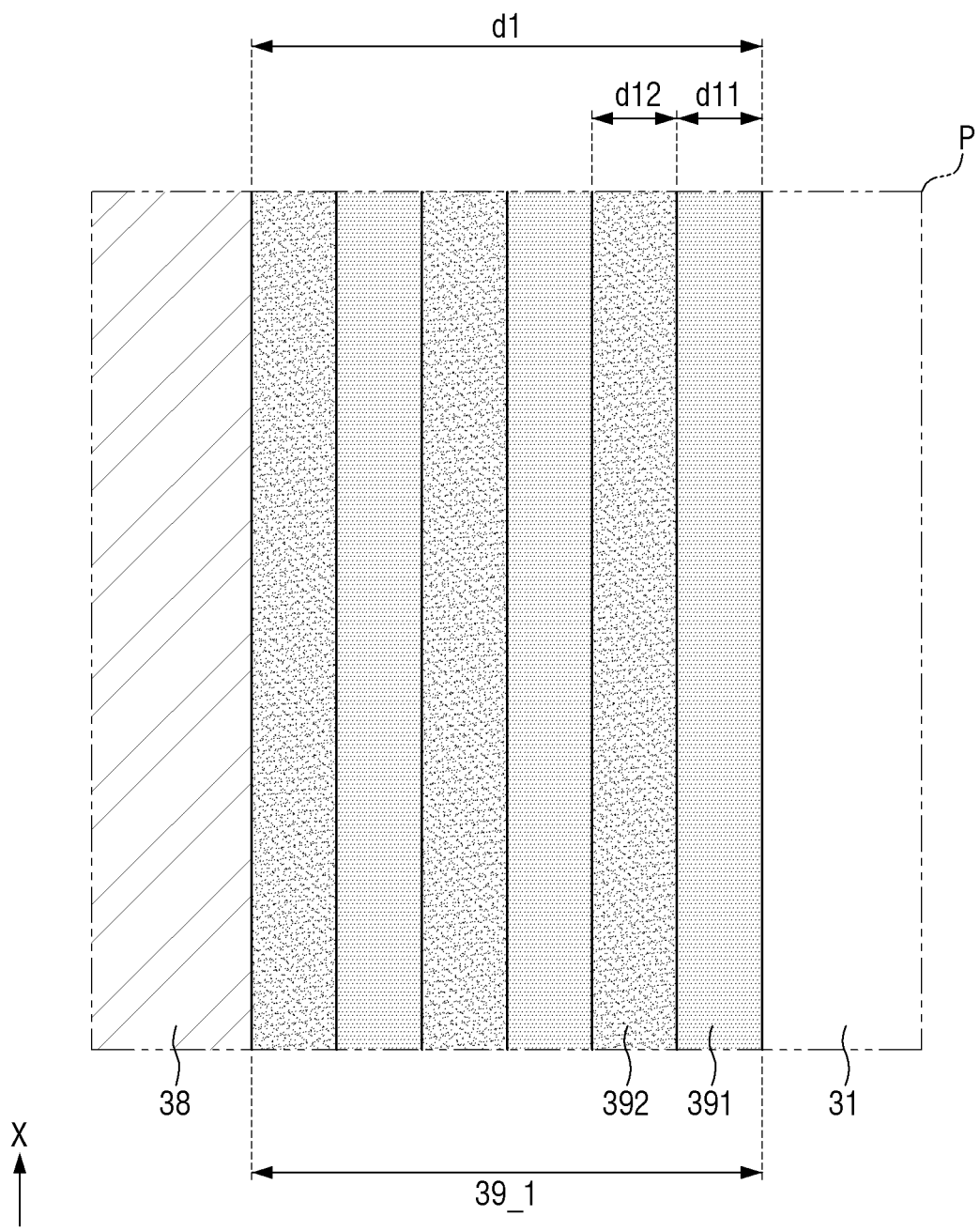
FIG. 6 is an enlarged view illustrating an example of region P of FIG. 5.

FIG. 5 is a cross-sectional view of a light emitting element according to one or more other embodiments. FIG. 6 is an enlarged view illustrating one or more embodiments of region P of FIG. 5.

Referring to FIG. 5, a light emitting element ED according to the embodiments is different from the light emitting element according to one or more embodiments of FIG. 2 in that a first element insulating layer 39_1 has a superlattice structure.

Referring to FIGS. 5 and 6, the first element insulating layer 39_1 may include a compound semiconductor layer having a single crystal structure. For example, the first element insulating layer 39_1 may have a superlattice structure in which first layers 391 including a first compound semiconductor and second layers 392 including a second compound semiconductor different from the first compound semiconductor are alternately and repeatedly stacked with each other. Although it has been illustrated in FIGS. 5 and 6 that the first layer 391 and the second layer 392 are alternately stacked multiple times (e.g., three times) in the first element insulating layer 39_1, the disclosure is not limited thereto. For example, the first element insulating layer 39_1 may also have a structure in which the first layer 391 and the second layer 392 are alternately stacked less than three times, or have a structure in which the first layer 391 and the second layer 392 are alternately stacked more than three times.

The first layers 391 and the second layers 392 of the first element insulating layer 39_1 may be alternately and sequentially stacked from the side surface of the light emitting element core 30 in a direction perpendicular to the side surface of the light emitting element core 30. For example, the first layer 391 may be directly on the side surface (or the outer circumferential surface) of the light emitting element core 30 and may surround the outer surface (or an outer circumferential surface) of the light emitting element core 30, and the second layer 392 may be on an outer surface (or an outer circumferential surface) of the first layer 391 and may surround the outer surface (or an outer circumferential surface) of the first layer 391.

The first layer 391 may include a compound semiconductor having a single crystal structure. For example, the first layer 391 may be referred to as a first compound semiconductor layer 391 or a first single crystal insulating film 391. In the specification, for convenience of explanation, the terms "first layer 391," "first compound semiconductor layer 391," or "first single crystal insulating film 391" may be used interchangeably with respect to the same reference numeral '391'.

In one or more embodiments, the first layer 391 may include a group III-V semiconductor compound. The first layer 391 may include a semiconductor compound having a chemical formula of AB (where A is a group III element and B is a group V element). For example, the first layer 391 may include AlN, but is not limited thereto.

In one or more embodiments, the first layer 391 may have a single crystal structure. In order for the first layer 391 to have a single crystal structure, a thickness d11 of the first layer 391 may be in a range equal to or less than a critical thickness of a material included in the first layer 391. For example, the thickness d11 of the first layer 391 may be in the range of 5 nm or less, for example, in the range of 2 nm to 3 nm. In this case, the first layer 391 may be a first single crystal insulating film 391 formed in a single crystal structure.

The second layer 392 may include a III-V semiconductor compound, but may include a material different from that of the first layer 391. The second layer 392 may include a semiconductor compound having a chemical formula of $A_xC_{1-x}B$ (where $0 \leq x < 1$, A and C are group III elements, and B is a group V element). For example, the second layer 392 may include $Al_xGa_{1-x}N$, but is not limited thereto.

In one or more embodiments, the second layer 392 may have a single crystal structure. In order for the second layer 392 to have a single crystal structure, a thickness d12 of the second layer 392 may be in a range equal to or less than a critical thickness of a material included in the second layer 392. For example, the thickness d12 of the second layer 392 may be in the range of 5 nm or less, for example, in the range of 2 nm to 3 nm. In this case, the second layer 392 may be a second single crystal insulating film 392 formed in a single crystal structure.

In one or more embodiments, the thickness d11 of the first layer 391 included in the first element insulating layer 39_1 and the thickness d12 of the second layer 392 may be the same as each other. However, the disclosure is not limited thereto, and in some embodiments, the thickness d11 of the first layer 391 included in the first element insulating layer 39_1 and the thickness d12 of the second layer 392 may be different from each other.

In one or more embodiments, the first element insulating layer 39_1 may have an $AlN/Al_xGa_{1-x}N$ ($0 \leq x < 1$) superlattice structure in which the first layers 391 including AlN and the second layers 392 including $Al_xGa_{1-x}N$ are alternately stacked (e.g., multiple times). Because the first element insulating layer 39_1 has the superlattice structure, a total thickness d1 of the first element insulating layer 39_1 may be greater than that of the first element insulating layer 39_1 including one single crystal insulating film. Accordingly, a plurality of layers having a single crystal structure are formed, such that surface defects of the light emitting element core 30 may be effectively or suitably improved, and insulation reliability of the first element insulating layer 39_1 may also be improved.

When the first element insulating layer 39_1 has the superlattice structure, each of the first layer 391 and the second layer 392 included in the first element insulating layer 39_1 may be formed by metal organic chemical vapor deposition method (MOCVD) or atomic layer deposition (ALD). In one or more embodiments, each of the first layer 391 and the second layer 392 included in the first element insulating layer 39_1 may be formed by atomic layer deposition (ALD) performed at a low temperature. Accordingly, each of the first layer 391 and the second layer 392 may include a group III-V semiconductor compound and may be formed as a layer having a single crystal structure.

In the embodiment, the first element insulating layer 39_1 has the superlattice structure in which a plurality of layers are alternately stacked, such that the first element insulating layer 39_1 may maintain the single crystal structure while being formed to have a great (e.g., a suitably large) thickness d1. Accordingly, the first element insulating layer 39_1 may effectively or suitably prevent or reduce the diffusion of impurities from the outside and/or the second element insulating layer 38 to the semiconductor layers of the light emitting element core 30. Accordingly, element efficiency and reliability of the light emitting element ED may be improved.

Figure 7:
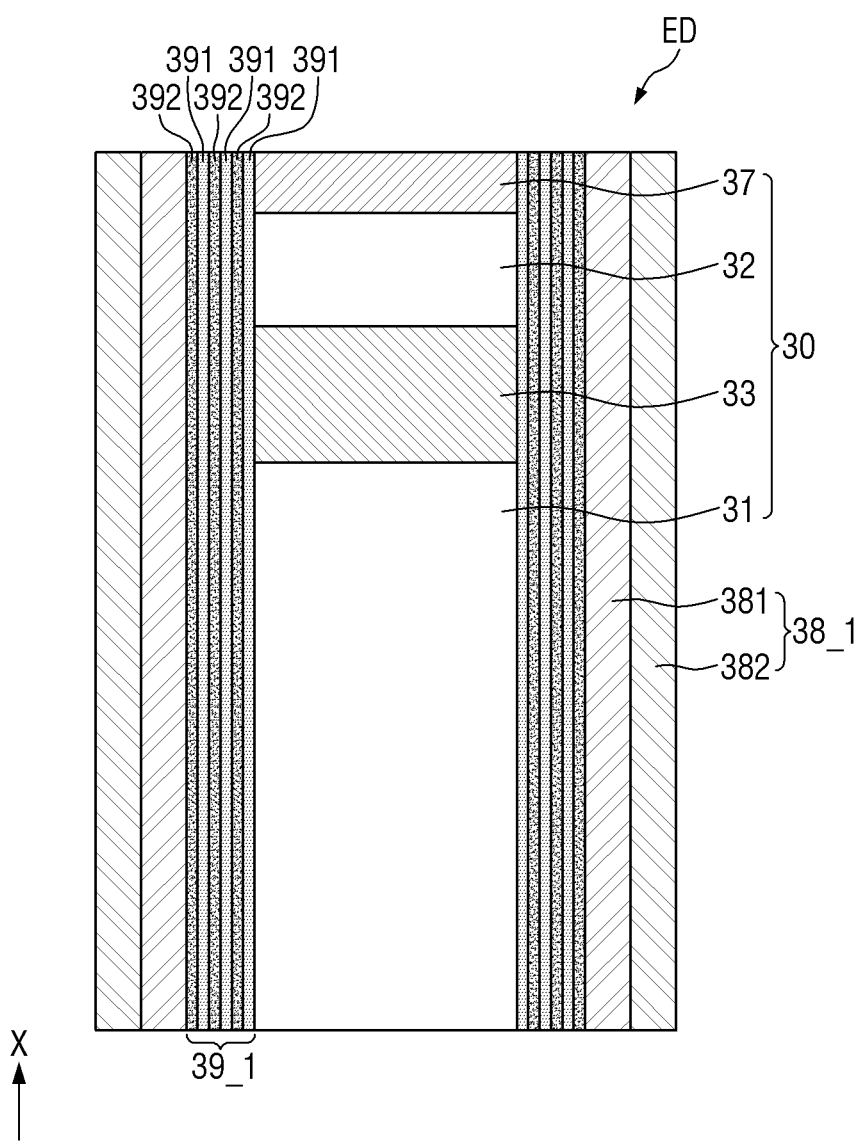
FIG. 7 is a cross-sectional view of a light emitting element according to one or more other embodiments.

FIG. 7 is a cross-sectional view of a light emitting element according to one or more other embodiments.

Referring to FIG. 7, a light emitting element ED according to the embodiments is different from the light emitting element according to the embodiments of FIG. 5 in that a second element insulating layer 38_1 includes a plurality of element insulating films.

For example, the second element insulating layer 38_1 may include a first element insulating film 381 and a second element insulating film 382. The first element insulating film 381 and the second element insulating film 382 of the second element insulating layer 38_1 according to the embodiments may include the same structures and materials as the first element insulating film 381 and the second element insulating film 382 of FIG. 4.

The first element insulating film 381 may surround an outer surface (or an outer circumferential surface) of the second layer 392 constituting an outer surface (or an outer circumferential surface) of the first element insulating layer 39_1. The first element insulating film 381 may protect the first semiconductor layer 31, the second semiconductor layer 32, and the light emitting layer 33 of the light emitting element core 30, and may prevent or reduce the risk of an electrical short circuit that may occur when the light emitting layer 33 is in direct contact with an electrode through which an electrical signal is transferred to the light emitting element ED. The second element insulating film 382 may serve to protect the first element insulating film 381.

Figure 8:
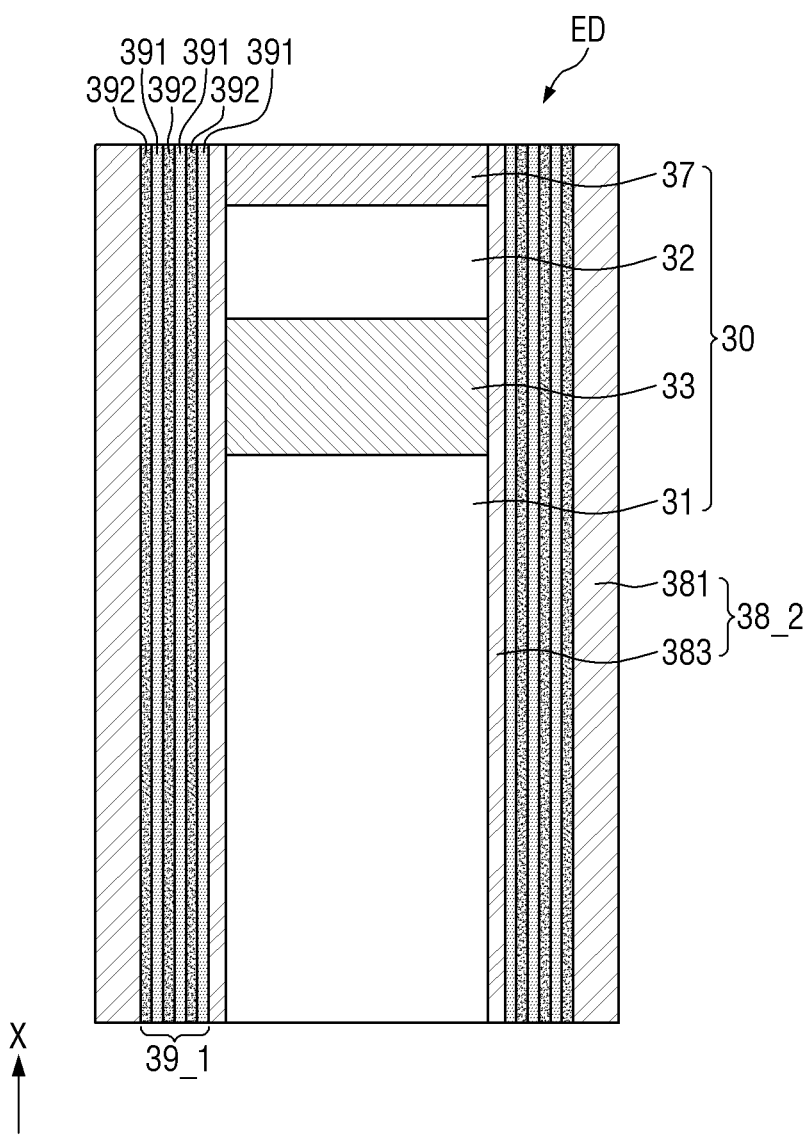
FIG. 8 is a cross-sectional view of a light emitting element according to one or more other embodiments.

FIG. 8 is a cross-sectional view of a light emitting element according to one or more other embodiments.

Referring to FIG. 8, a light emitting element ED according to the embodiments is different from the light emitting element according to the embodiments of FIG. 7 in that a second element insulating layer 38_2 includes a first element insulating film 381 and a third element insulating film 383, and the first element insulating layer 39_1 having the superlattice structure is interposed between the first element insulating film 381 and the third element insulating film 383.

For example, the second element insulating layer 38_2 may include a first element insulating film 381 and a third element insulating film 383.

The third element insulating film 383 may surround the side surface of the light emitting element core 30. The third element insulating film 383 may be directly on the side surface of the light emitting element core 30. The third element insulating film 383 may include a material having insulation properties. For example, the third element insulating film 383 may include silicon oxide ($SiO_x$), silicon nitride ($SiN_x$), silicon oxynitride ($SiO_xN_y$), aluminum nitride (AlN), aluminum oxide ($Al_xO_y$), titanium oxide ($TiO_x$), zirconium oxide ($ZrO_x$), hafnium oxide ($HfO_x$), and/or the like.

The first element insulating film 381 may be provided on an outer surface (or an outer circumferential surface) of the third element insulating film 383 and may surround the outer surface of the third element insulating film 383. The first element insulating film 381 may be spaced apart from the third element insulating film 383.

The first element insulating layer 39_1 may be between the first element insulating film 381 and the third element insulating film 383. The first element insulating layer 39_1 may be on the outer surface of the third element insulating film 383, and the first element insulating film 381 may be on an outer surface (or an outer circumferential surface) of the first element insulating layer 39_1.

In one or more embodiments, the second element insulating layer 38_2 may further include an element insulating film between the third element insulating film 383 and the first element insulating layer 39_1. In this case, the first element insulating layer 39_1 may be on an outer surface (or an outer circumferential surface) of the element insulating film additionally positioned on the third element insulating film 383.

Figure 9:
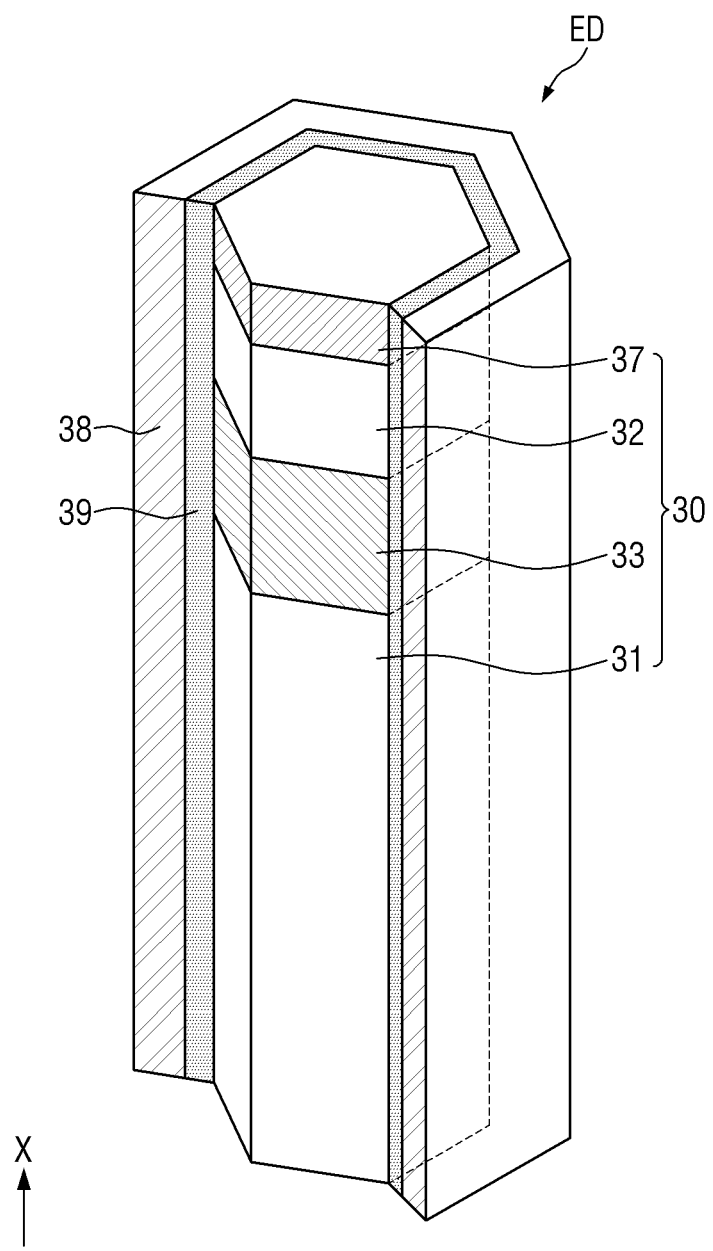
FIG. 9 is a schematic perspective view of a light emitting element according to one or more other embodiments.
Figure 10:
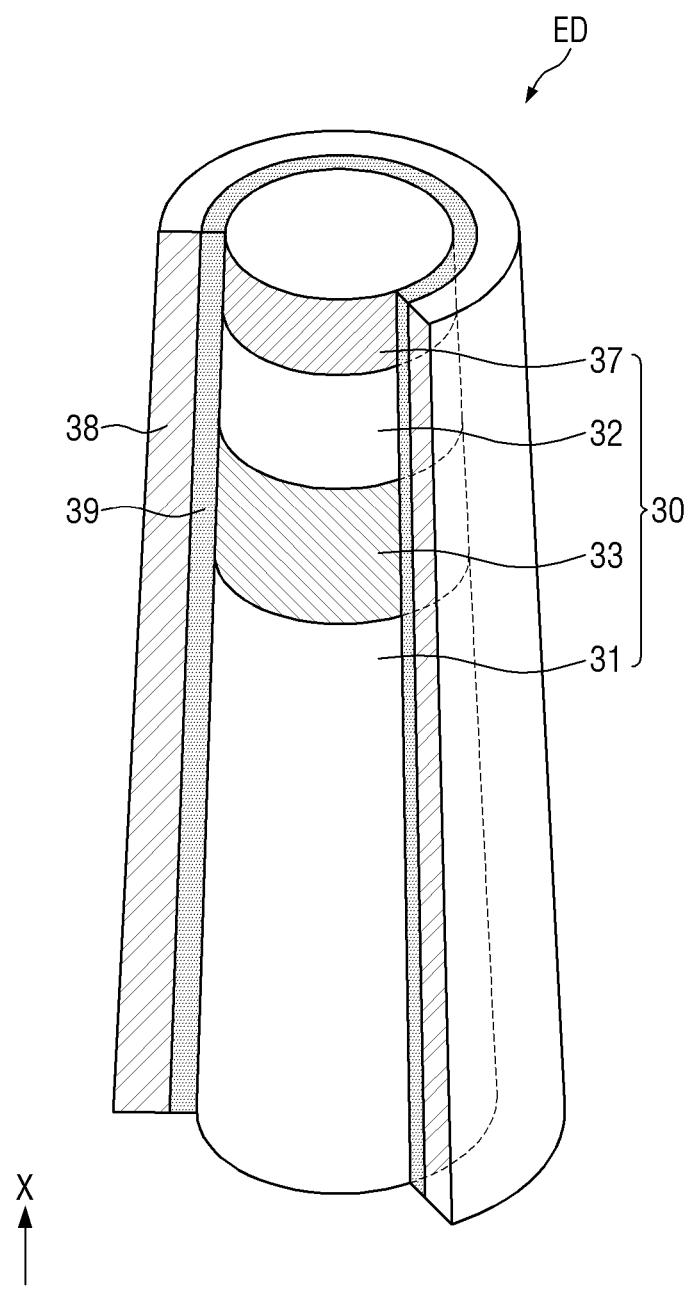
FIG. 10 is a schematic perspective view of a light emitting element according to one or more other embodiments.

FIG. 9 is a schematic perspective view of a light emitting element according to one or more other embodiments. FIG. 10 is a schematic perspective view of a light emitting element according to one or more other embodiments.

FIGS. 9 and 10 illustrate embodiments of light emitting elements ED having various shapes. For example, the light emitting element ED according to the embodiments of FIG. 9 may extend in one direction and may have a hexagonal prismatic shape. A light emitting element core 30 of the light emitting element ED according to the embodiments of FIG. 9 may have a hexagonal prismatic shape, and a first element insulating layer 39 and a second element insulating layer 38 may be positioned on a plurality of side surfaces of the light emitting element core 30 so as to surround the plurality of side surfaces of the light emitting element core 30. The light emitting element ED according to the embodiments of FIG. 10 may extend in one direction X and may have a truncated cone shape. The light emitting element ED according to the embodiments of FIG. 10 may have a truncated cone shape.

Hereinafter, processes (e.g., acts) of manufacturing the light emitting element ED according to one or more embodiments of FIG. 2 will be described in the order in which they may be performed and with reference to the drawings, but embodiments of the present disclosure are not limited thereto.

FIGS. 11 to 17 are cross-sectional views illustrating processes (e.g., acts) of a method of manufacturing a light emitting element.

Hereinafter, a first direction DR1, a second direction DR2, and a third direction DR3 are defined as shown in the drawings of the processes of manufacturing the light emitting element ED. The first direction DR1 and the second direction DR2 may be directions perpendicular (or substantially perpendicular) to each other, and the third direction DR3 may be a direction perpendicular (or substantially perpendicular) to a plane on which the first direction DR1 and the second direction DR2 are positioned.

The third direction DR3 may be a direction parallel (or substantially parallel) to the one direction X, which is an extension direction of the light emitting element ED formed on a lower substrate 1000. In the present specification, unless otherwise stated, "upper portion" may refer to one side in the third direction DR3 and may refer to a direction in which a plurality of semiconductor layers of the light emitting element ED are stacked on one surface (or an upper surface) of a lower substrate 1000, and "upper surface" may refer to a surface facing the one side of the third direction DR3. In addition, "lower portion" may refer to another side in the third direction DR3, and "lower surface" may refer to a surface facing the other side in the third direction DR3.

Figure 11:
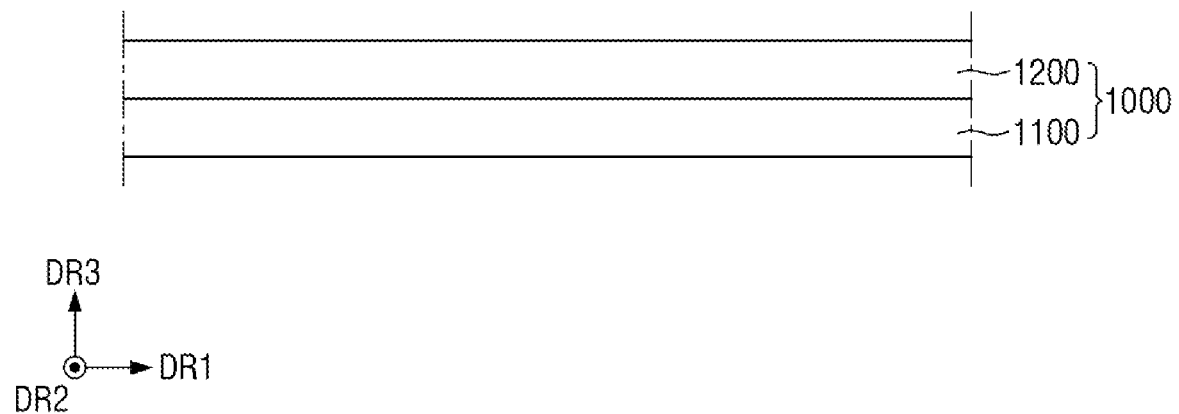
FIGS. 11 to 17 are cross-sectional views illustrating processes (e.g., acts) of a method of manufacturing a light emitting element.

First, referring to FIG. 11, the lower substrate 1000 is prepared.

In one or more embodiments, the lower substrate 1000 may include a base substrate 1100 and a buffer material layer 1200 on the base substrate 1100.

The base substrate 1100 may include a sapphire ($Al_xO_y$) substrate and a transparent substrate such as a glass substrate. However, the disclosure is not limited thereto, and the base substrate 1100 may also include a conductive substrate made of GaN, SiC, ZnO, Si, GaP, GaAs, and/or the like. In one or more embodiments, the base substrate 1100 may be a sapphire substrate ($Al_xO_y$).

A plurality of semiconductor layers may be formed on the base substrate 1100. The plurality of semiconductor layers may be formed by growing seed crystals on the base substrate 1100 by an epitaxial method. A method of forming the semiconductor layers may be electron beam deposition, physical vapor deposition (PVD), chemical vapor deposition (CVD), plasma laser deposition (PLD), dual-type thermal evaporation, sputtering, metal organic chemical vapor deposition (MOCVD), and/or the like.

The buffer material layer 1200 may be formed on one surface (e.g., an upper surface) of the base substrate 1100. The buffer material layer 1200 may serve to decrease a lattice constant difference between the base substrate 1100 and a first semiconductor material layer 3100 (see FIG. 12) to be described in more detail herein below. The buffer material layer 1200 may include an undoped semiconductor. The buffer material layer 1200 may include the same material as a first semiconductor material layer 3100 to be described in more detail herein below, but may include a material that is not doped with a first conductivity-type dopant or a second conductivity-type dopant, for example, an n-type dopant or a p-type dopant. It has been illustrated in FIG. 11 that one buffer material layer 1200 is stacked, but the disclosure is not limited thereto, and a plurality of buffer material layers 1200 may also be formed. The buffer material layer 1200 may also not be provided, depending on a type (or kind) of the base substrate 1100.

Figure 12:
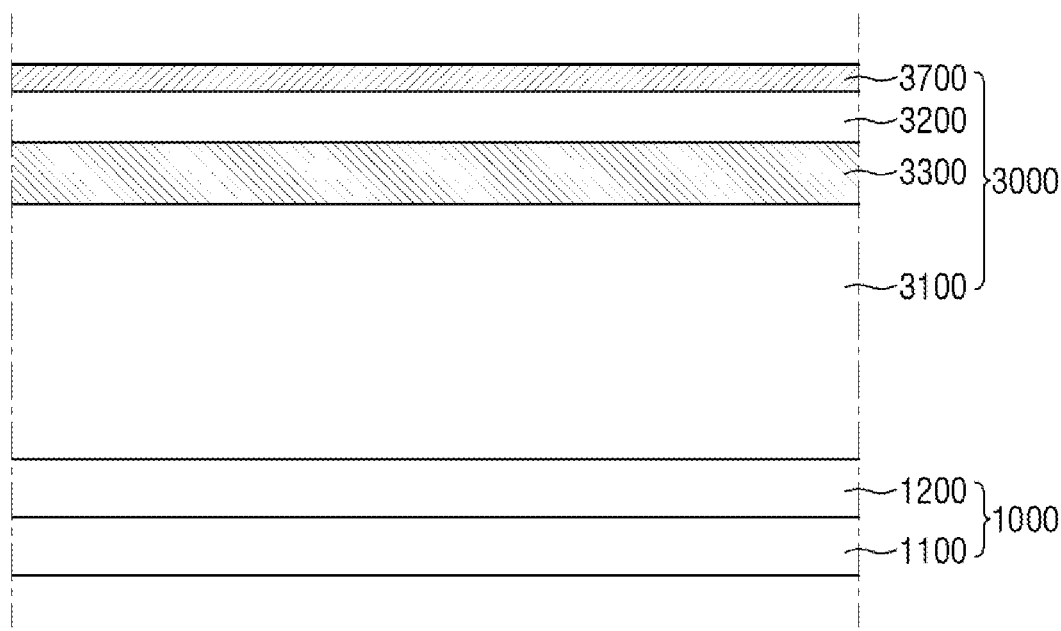
Figure 12:
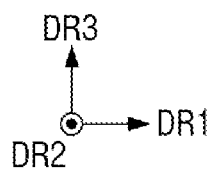

Next, referring to FIG. 12, a first stacked structure 3000 is formed on the lower substrate 1000.

For example, the first stacked structure 3000 in which a first semiconductor material layer 3100, a light emitting material layer 3300, a second semiconductor material layer 3200, and an electrode material layer 3700 are sequentially stacked is formed on the lower substrate 1000.

A plurality of layers included in the first stacked structure 3000 may correspond to respective layers included in the light emitting element core 30 according to one or more embodiments. For example, the first semiconductor material layer 3100, the light emitting material layer 3300, the second semiconductor material layer 3200, and the electrode material layer 3700 of the first stacked structure 3000 may correspond to the first semiconductor layer 31, the light emitting layer 33, the second semiconductor layer 32, and the element electrode layer 37 of the light emitting element core 30, respectively, and may include the same materials as the materials included in the respective layers.

Figure 13:
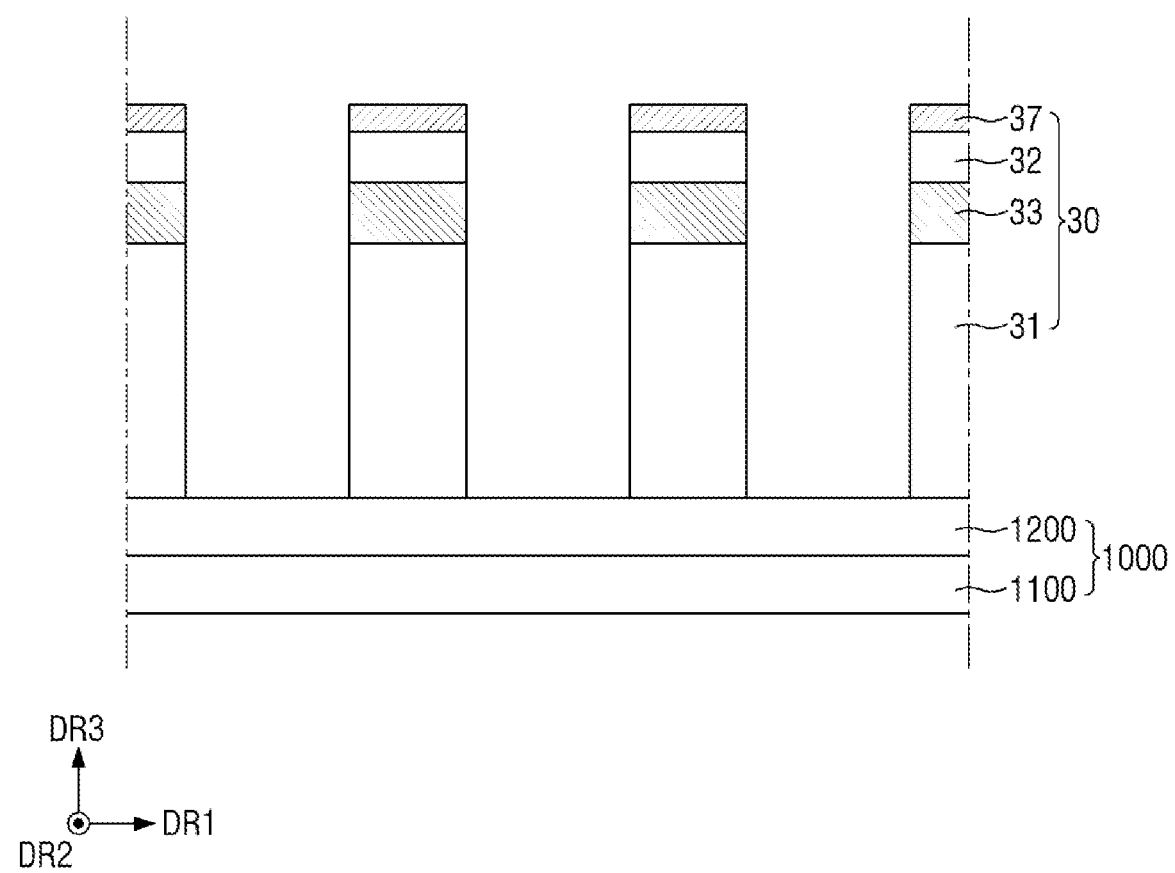

Next, referring to FIG. 13, a plurality of light emitting element cores 30 spaced apart from each other are formed by etching the first stacked structure 3000.

For example, the light emitting element cores 30 spaced apart from each other as illustrated in FIG. 13 may be formed through a process of etching the first stacked structure 3000 in a direction perpendicular (or substantially perpendicular) to the upper surface of the lower substrate 1000, for example, in the third direction DR3. The first stacked structure 3000 may be etched by a suitable patterning method. For example, the patterning method may be performed by forming an etch mask layer on the first stacked structure 3000 and etching the first stacked structure 3000 in the third direction DR3 along the etch mask layer.

For example, a process of etching the first stacked structure 3000 may be a dry etching method, a wet etching method, a reactive ion etching (RIE) method, an inductively coupled plasma reactive ion etching (ICP-RIE) method, and/or the like. In a case of the dry etching, anisotropic etching is possible, and the dry etching may thus be suitable for vertical etching. In one or more embodiments, the etching of the first stacked structure 3000 may be performed using both the dry etching method and the wet etching method. For example, the first stacked structure 3000 is etched in the third direction DR3 through the dry etching method, and then etched through the wet etching method, which is an isotropic etching method, such that the etched sidewalls may be placed on a plane perpendicular (or substantially perpendicular) to the upper surface of the lower substrate 1000.

Defects may occur on surfaces of the plurality of light emitting element cores 30 formed by etching the first stacked structure 3000, due to an etchant used in the process of etching the first stacked structure 3000. For example, defects of semiconductor materials may occur on surfaces of the semiconductor layers included in each of the plurality of light emitting element cores 30. The defects formed on an outer surface of the light emitting element core 30 may cause leakage of electrons injected into the semiconductor layers and/or trapping of holes injected into the semiconductor layers, and may hinder a combination of the electrons and the holes, resulting in a decrease in light efficiency of the light emitting element ED. In addition, when a second element insulating layer (e.g., second element insulating layer 38) is directly formed on the outer surface of the light emitting element core 30 having the surface defects, impurities may be diffused from the second element insulating layer to the semiconductor layers along a boundary between the second element insulating layer and the light emitting element core 30, such that element reliability and efficiency of the light emitting element ED may be decreased.

Figure 14:
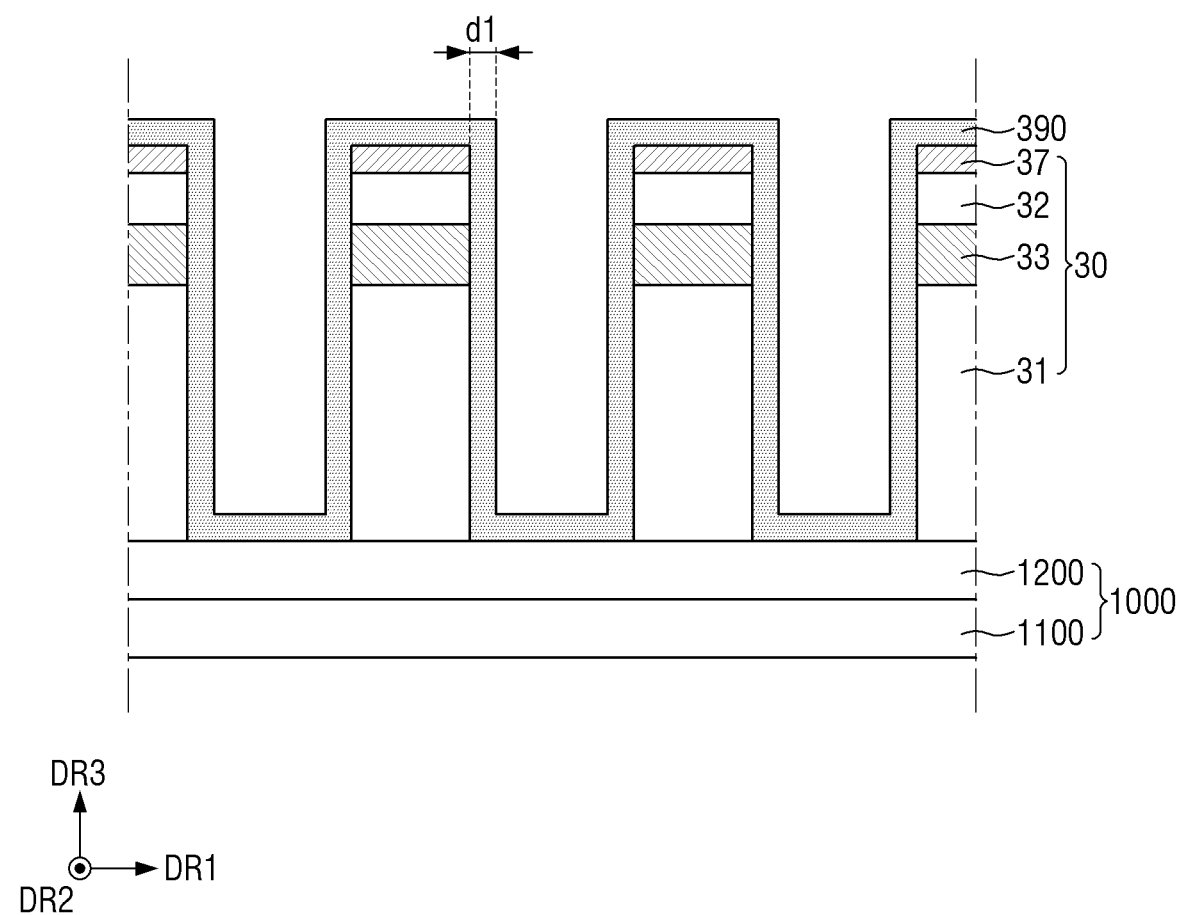

Next, referring to FIG. 14, a first insulating material layer 390 is formed on the plurality of light emitting element cores 30.

As described above, in the process of etching the first stacked structure 3000 in order to form the light emitting element core 30, the surface defects may occur on the outer surfaces of the semiconductor layers of the light emitting element core 30, and the first insulating material layer 390 having a single crystal structure may be directly formed on the side surface of the light emitting element core 30 in order to decrease the surface defects.

The first insulating material layer 390 may be formed on an entire surface of the lower substrate 1000 to be formed not only on the outer surface of the light emitting element core 30, but also on the upper surface of the lower substrate 1000 exposed by the light emitting element core 30. The outer surface of the light emitting element core 30 may include an upper surface and a side surface of the light emitting element core 30. The first insulating material layer 390 may correspond to (e.g., may later form through a subsequent process) the first element insulating layer 39 of the light emitting element ED.

In one or more embodiments, the first insulating material layer 390 may include the material included in the first element insulating layer 39, for example, the insulating material having the single crystal structure. In one or more embodiments, the first insulating material layer 390 may include aluminum nitride (AlN) having a single crystal structure, aluminum oxide ($Al_xO_y$) having a single crystal structure, and/or the like.

The first insulating material layer 390 needs to maintain the single crystal structure in order to improve efficiency of the light emitting element ED while maintaining reliability of the light emitting element ED, as described above. Accordingly, the first insulating material layer 390 may be formed to have a set or predetermined thickness suitable for maintaining the single crystal structure on the outer surface of the light emitting element core 30. A thickness d1 of the first insulating material layer 390 may be in a range equal to or less than a critical thickness of the material included in the first insulating material layer 390. For example, when the first element insulating layer 39 includes aluminum nitride (AlN) having a single crystal structure, the thickness d1 of the first element insulating layer 39 may be in the range of 5 nm or less. In this case, the first element insulating layer 39 may be formed to maintain the single crystal structure.

In one or more embodiments in which the first insulating material layer 390 includes the insulating material having the single crystal structure, the first insulating material layer 390 may be formed by atomic layer deposition (ALD), chemical vapor deposition (CVD), metal organic chemical vapor deposition (MOCVD), and/or the like.

In one or more embodiments, the first insulating material layer 390 may correspond to the first element insulating layer 39_1 according to the embodiments of FIG. 5. In this case, the first insulating material layer 390 may be formed to have a superlattice structure. When the first insulating material layer 390 has the superlattice structure, the first insulating material layer 390 may be formed so that a plurality of layers including a compound semiconductor having a single crystal structure are alternately stacked therein. In this case, each of the plurality of layers may be formed to have a thickness equal to or less than a critical thickness of a material included in the plurality of layers.

In one or more embodiments in which the first insulating material layer 390 has the superlattice structure, a plurality of layers (e.g., a plurality of single crystal insulating films) of the first insulating material layer 390 may be formed by atomic layer deposition (ALD) performed at a low temperature.

Figure 15:
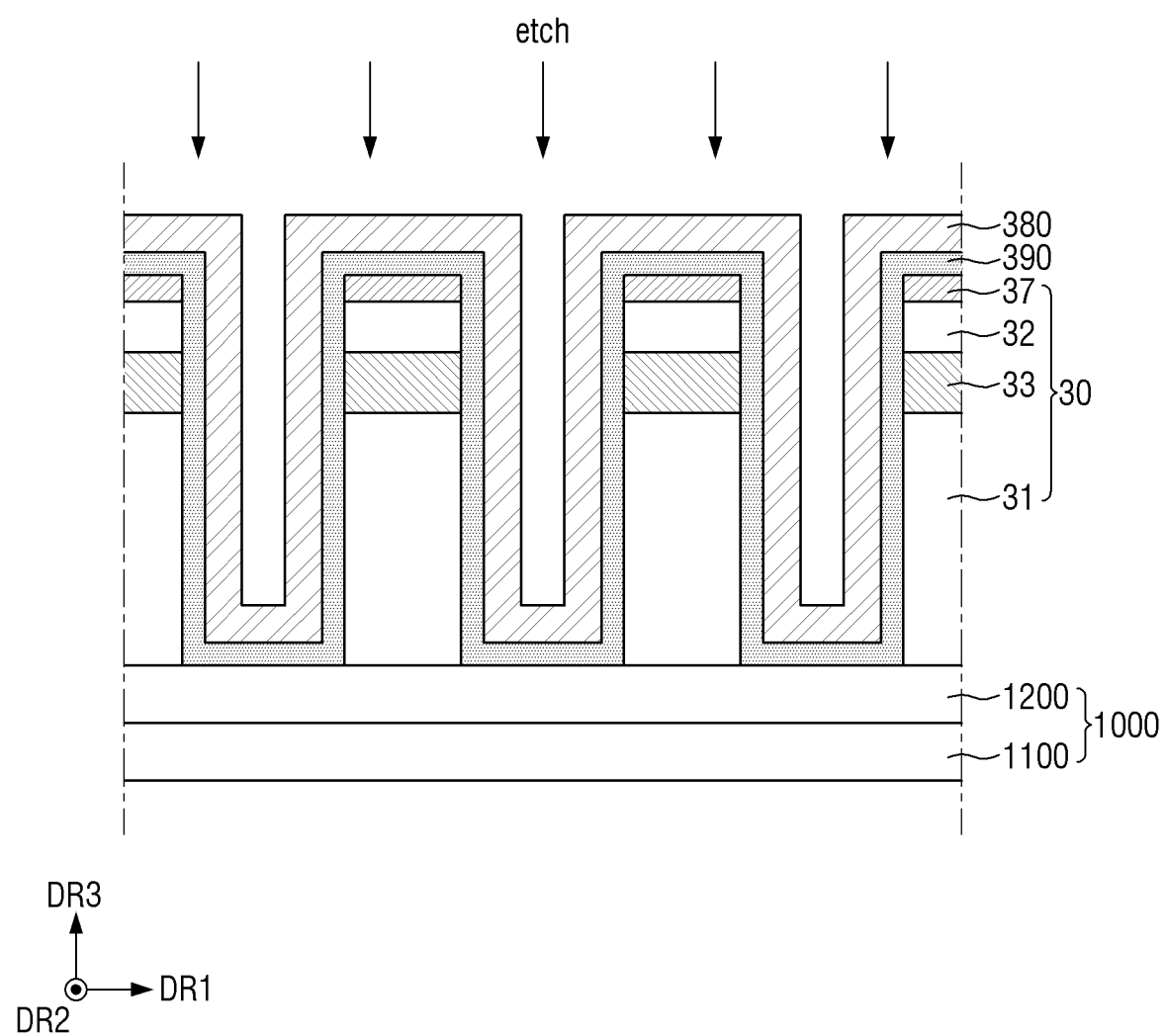

Next, referring to FIG. 15, a second insulating material layer 380 is formed on the first insulating material layer 390. The second insulating material layer 380 may correspond to (e.g., may later form through a subsequent process) the second element insulating layer 38. Accordingly, the second insulating material layer 380 may include the material included in the second element insulating layer 38. For example, the second insulating material layer 380 may be formed by atomic layer deposition (ALD) and/or chemical vapor deposition (CVD).

Figure 16:
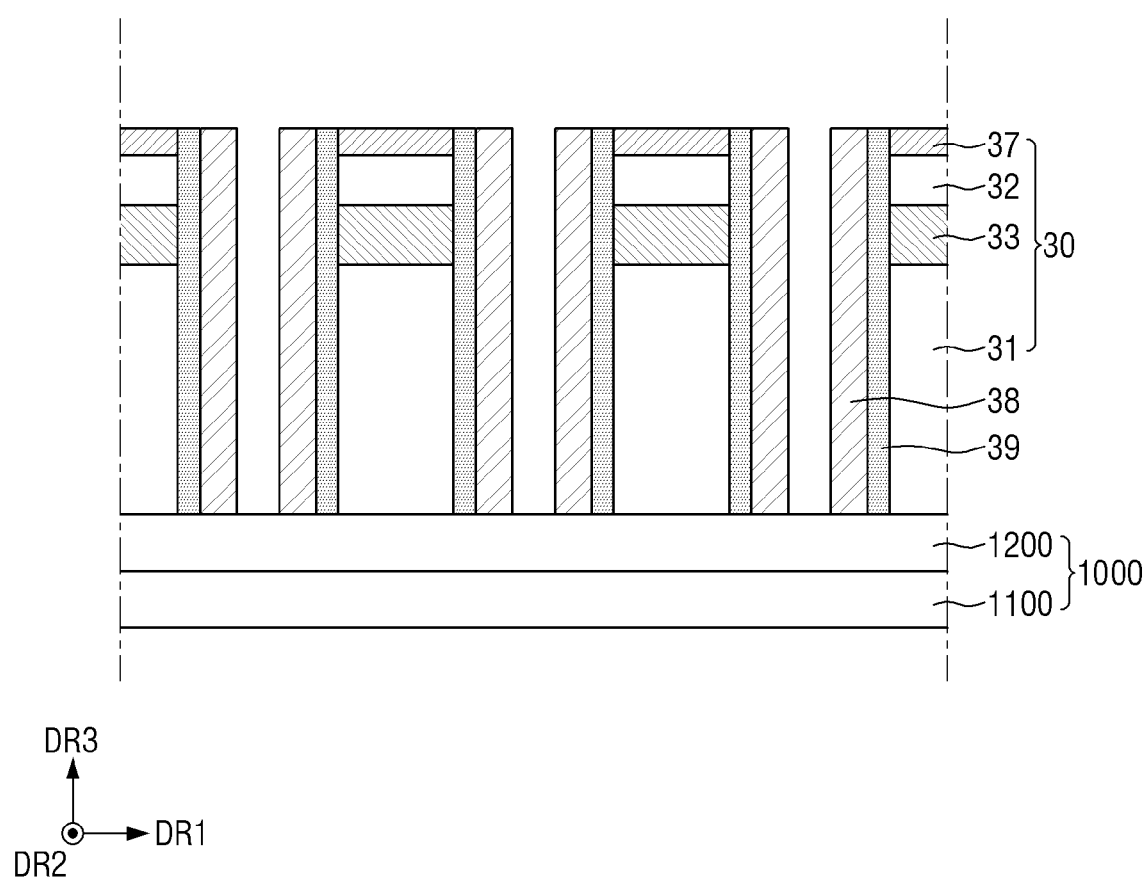

Next, referring to FIG. 16, the first element insulating layers 39 and the second element insulating layers 38 surrounding the side surfaces of the light emitting element cores 30 are formed by partially removing the first insulating material layer 390 and the second insulating material layer 380.

A process of forming the first element insulating layers 39 and the second element insulating layers 38 may include an etching process of partially removing the first insulating material layer 390 and the second insulating material layer 380 so that one end surfaces of the light emitting element cores 30, for example, upper surfaces of the element electrode layers 37, are respectively exposed. The process of partially removing the first insulating material layer 390 and the second insulating material layer 380 may be performed through a process such as dry etching, which is anisotropic etching, and/or etch-back.

Figure 17:
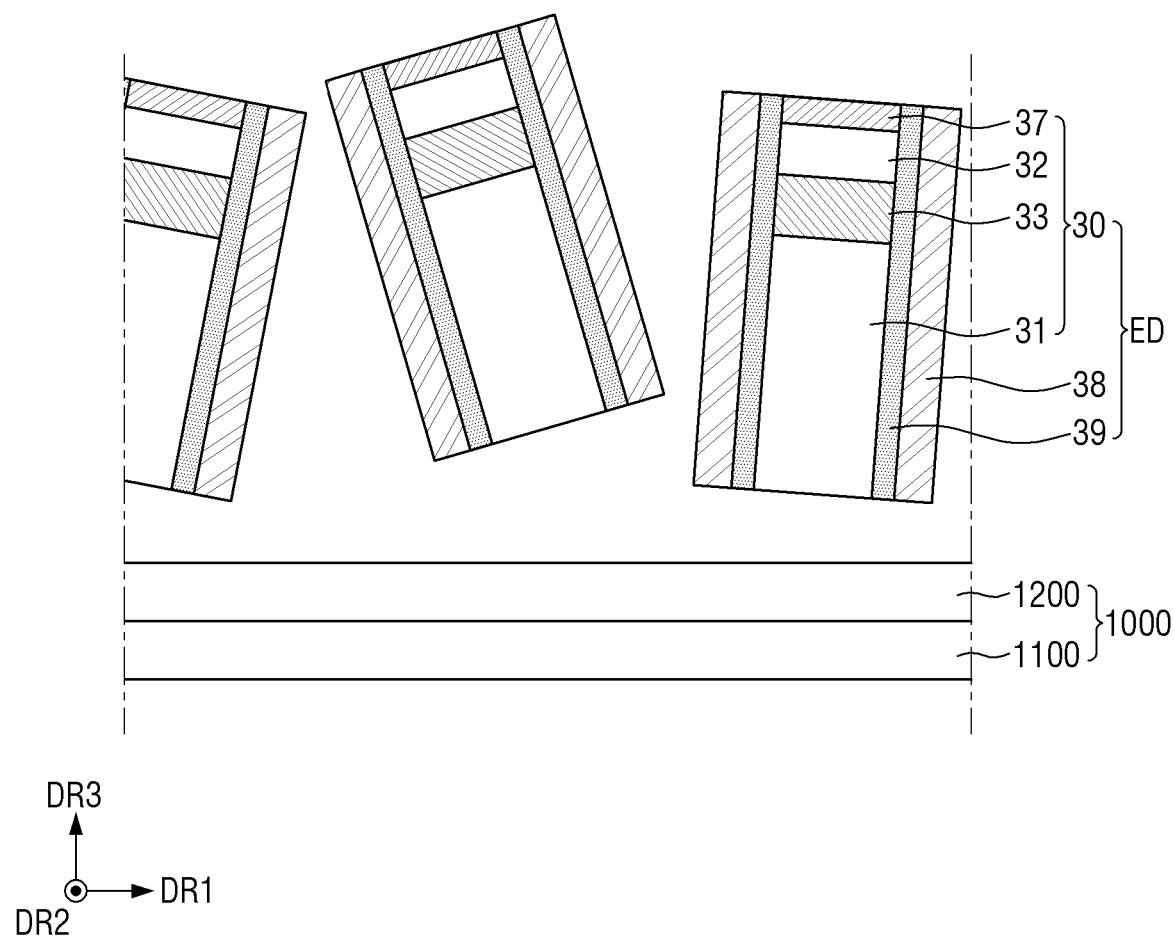

Next, referring to FIG. 17, a plurality of light emitting elements ED are separated from the lower substrate 1000. A process of separating the plurality of light emitting elements ED from the lower substrate 1000 is not particularly limited. For example, a process of separating the plurality of light emitting elements ED may be performed by a physical separation method, a chemical separation method, and/or the like.

Figure 18:
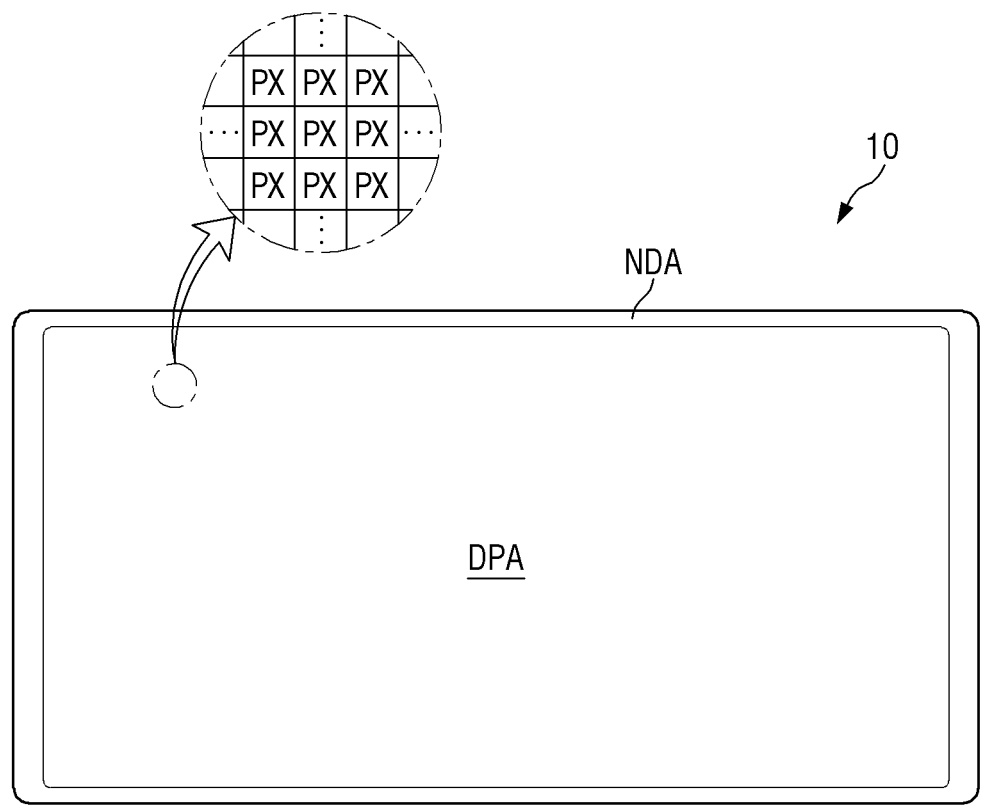
FIG. 18 is a plan view of a display device according to one or more embodiments.

FIG. 18 is a plan view of a display device according to one or more embodiments.

Referring to FIG. 18, a display device 10 displays a moving image and/or a still image. The display device 10 may refer to all suitable electronic devices that provide display screens. For example, televisions, laptop computers, monitors, billboards, the Internet of Things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, camcorders, and the like, which provide display screens, may be included in the display device 10.

The display device 10 includes a display panel providing a display screen. Examples of the display panel may include an inorganic light emitting diode display panel, an organic light emitting display panel, a quantum dot light emitting display panel, a plasma display panel, a field emission display panel, and the like. Hereinafter, a case where the above-described light emitting element ED, for example, an inorganic light emitting diode display panel, is applied as an example of the display panel will be described by way of example, but the disclosure is not limited thereto, and the same technical spirit may be applied to other display panels if applicable.

Hereinafter, a fourth direction DR4, a fifth direction DR5, and a sixth direction DR6 are defined as shown in the drawings of one or more embodiments for describing the display device 10. The fourth direction DR4 and the fifth direction DR5 may be directions perpendicular (e.g., substantially perpendicular) to each other in one plane. The sixth direction DR6 may be a direction perpendicular (e.g., substantially perpendicular) to the plane in which the fourth direction DR4 and the fifth direction DR5 are positioned. The sixth direction DR6 is perpendicular (e.g., substantially perpendicular) to each of the fourth direction DR4 and the fifth direction DR5. In one or more embodiments for describing the display device 10, the sixth direction DR6 refers to a thickness direction of the display device 10.

The display device 10 may have a rectangular shape, in a plan view, in which a length in the fourth direction DR4 is longer than a length in the fifth direction DR5, and which includes long sides and short sides. A corner portion where the long side and the short side of the display device 10 meet in a plan view may be right-angled, but is not limited thereto, and may also have a rounded curved shape. The shape of the display device 10 in a plan view is not limited to that described above, and may be other suitable shapes such as a square shape, a quadrangular shape with rounded corners (vertices), a polygonal shape, and/or a circular shape.

A display surface of the display device 10 may be provided on one side in the sixth direction DR6, which is the thickness direction. In embodiments for describing the display device 10, unless otherwise stated, "upper portion" may refer to one side in the sixth direction DR6 and may refer to a display direction, and "upper surface" refers to a surface facing the one side in the sixth direction DR6. In addition, "lower portion" may refer to another side in the sixth direction DR6 and may refer to an opposite direction to the display direction, and "lower surface" may refer to a surface facing the other side in the sixth direction DR6. In addition, "left", "right", "upper", and "lower" refer to directions when the display device 10 is viewed in a plan view. For example, "right side" refers to one side in the fourth direction DR4, "left side" refers to the other side in the fourth direction DR4, "upper side" refers to one side in the fifth direction DR5, and "lower side" refers to the other side in the fifth direction DR5.

The display device 10 may include a display area DPA and a non-display area NDA. The display area DPA is an area in which a screen (e.g., image) may be displayed, and the non-display area NDA is an area in which a screen (e.g., image) is not displayed.

A shape of the display area DPA may follow the shape of the display device 10. For example, the shape of the display area DPA may have a rectangular shape in a plan view, similar to the overall shape of the display device 10. The display area DPA may occupy substantially the center of the display device 10.

The display area DPA may include a plurality of pixels PX. The plurality of pixels PX may be arranged in a matrix direction (e.g., a matrix orientation). A shape of each pixel PX may be a rectangular or square shape in a plan view. However, the disclosure is not limited thereto, and the shape of each pixel PX may be a rhombic shape in which each side is inclined with respect to one direction. The respective pixels PX may be alternately arranged with each other in a stripe pattern or a PenTile®/PENTILE® pattern (PENTILE® is a registered trademark owned by Samsung Display Co., Ltd.).

The non-display area NDA may be around the display area DPA. The non-display area NDA may entirely or partially surround the display area DPA. In one or more embodiments, the display area DPA may have a rectangular shape, and the non-display area NDA may be adjacent to four sides of the display area DPA. The non-display area NDA may constitute a bezel of the display device 10. Wirings, circuit drivers, and/or a pad part on which an external device is mounted, which are included in the display device 10, may be positioned in the non-display area NDA.

Figure 19:
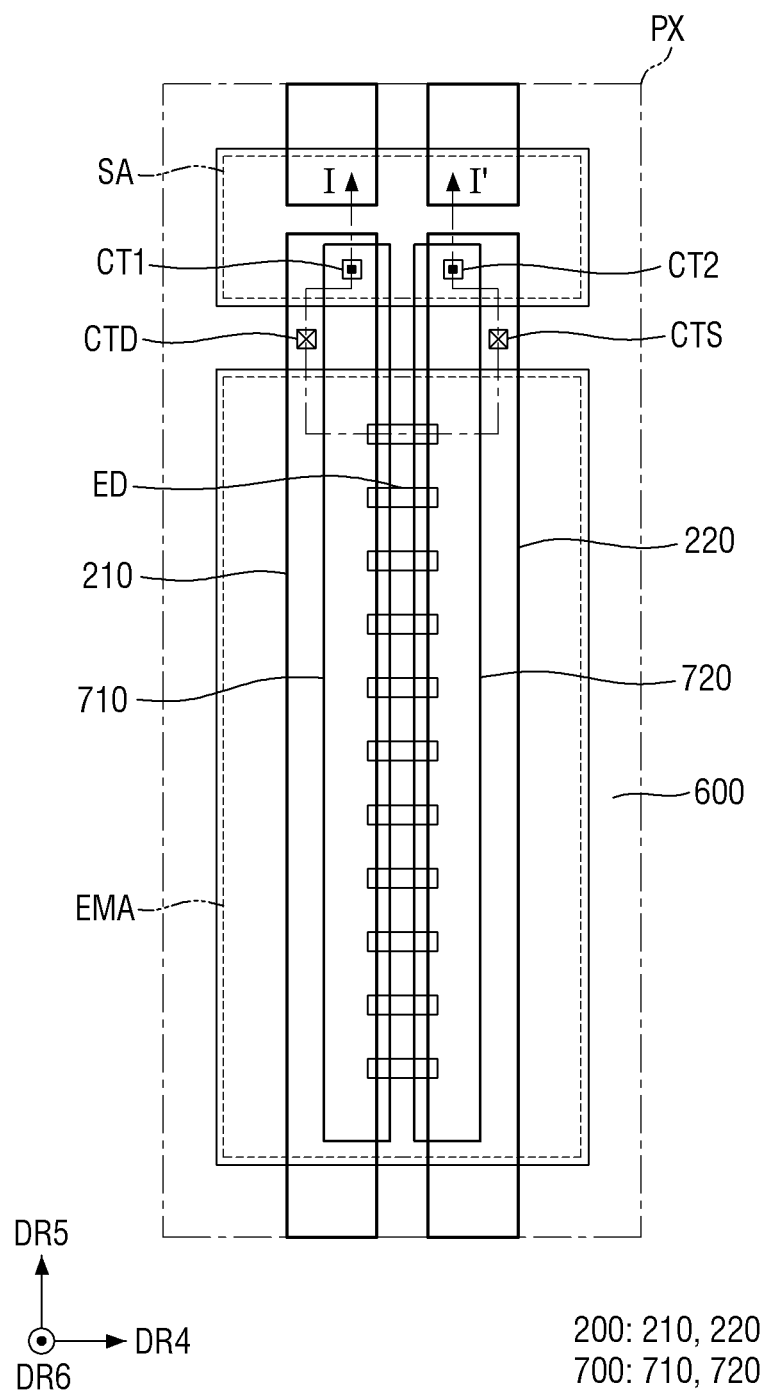
FIG. 19 is a plan layout diagram illustrating one pixel of the display device according to one or more embodiments.
Figure 20:
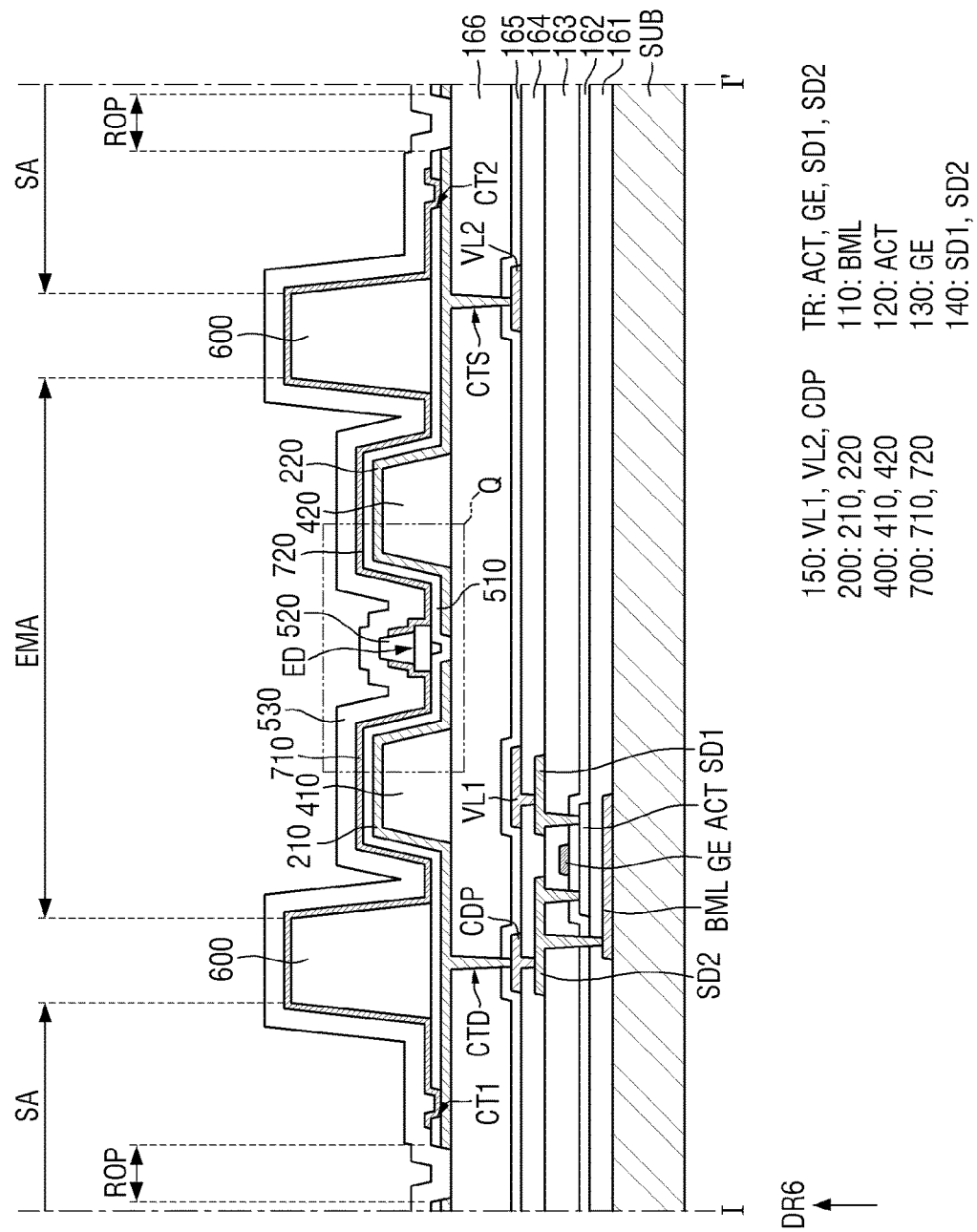
FIG. 20 is a cross-sectional view taken along line I-I' of FIG. 19 according to one or more embodiments.

FIG. 19 is a plan layout diagram illustrating one pixel of the display device according to one or more embodiments. FIG. 20 is a cross-sectional view, according to one or more embodiments, taken along line I-I' of FIG. 19.

Referring to FIG. 19, each pixel PX of the display device 10 may include an emission area EMA and a non-emission area. The emission area EMA may be defined as an area in which light emitted from the light emitting elements ED is emitted, and the non-emission area may be defined as an area to which the light emitted from the light emitting elements ED does not arrive and thus, in which the light is not emitted.

The emission area EMA may include an area in which the light emitting elements ED are provided and an area adjacent thereto. In addition, the emission area may further include an area in which the light emitted from the light emitting elements ED is reflected and/or refracted by other members and then emitted.

Each pixel PX may further include a sub-area SA in the non-emission area. The light emitting elements ED may not be positioned in the sub-area SA. The sub-area SA may be provided on an upper side of the emission area EMA in a plan view in one pixel PX. The sub-area SA may be between emission areas EMA of pixels PX arranged neighboring (e.g., adjacent) to each other in the fifth direction DR5. The sub-area SA may include an area in which an electrode layer 200 and a contact electrode 700 are electrically connected (e.g., electrically coupled) to each other through contact parts CT1 and CT2.

The sub-area SA may include a separation part ROP. The separation part ROP of the sub-area SA may be an area in which first electrodes 210 and second electrodes 220 included in electrode layers 200, included in respective pixels PX neighboring to each other along the fifth direction DR5, are separated from each other.

Referring to FIGS. 19 and 20, the display device 10 may include a substrate SUB, a circuit element layer on the substrate SUB, and a light emitting element layer on the circuit element layer.

The substrate SUB may be an insulating substrate. The substrate SUB may be made of an insulating material such as glass, quartz, and/or a polymer resin. The substrate SUB may be a rigid substrate, but may also be a flexible substrate capable of being bent, folded, and/or rolled.

The circuit element layer may be on the substrate SUB. The circuit element layer may include a lower metal layer 110, a semiconductor layer 120, a first conductive layer 130, a second conductive layer 140, a third conductive layer 150, and a plurality of insulating films.

The lower metal layer 110 is on the substrate SUB. The lower metal layer 110 may include a light blocking pattern BML. The light blocking pattern BML may be below a transistor TR so as to cover at least a channel region of an active layer ACT of the transistor TR. However, the disclosure is not limited thereto, and the light blocking pattern BML may not be provided.

The lower metal layer 110 may include a material capable of blocking or reducing light. For example, the lower metal layer 110 may be formed of an opaque metal material capable of blocking or reducing transmission of the light.

A buffer layer 161 may be provided on the lower metal layer 110. The buffer layer 161 may cover an entire surface of the substrate SUB on which the lower metal layer 110 is positioned. The buffer layer 161 may serve to protect a plurality of transistors from moisture permeating through the substrate SUB vulnerable to moisture permeation.

The semiconductor layer 120 is on the buffer layer 161. The semiconductor layer 120 may include the active layer ACT of the transistor TR. The active layer ACT of the transistor TR may overlap the light blocking pattern BML of the lower metal layer 110, as described above.

The semiconductor layer 120 may include polycrystalline silicon, single crystal silicon, an oxide semiconductor, and/or the like. In one or more embodiments, when the semiconductor layer 120 includes the polycrystalline silicon, the polycrystalline silicon may be formed by crystallizing amorphous silicon. When the semiconductor layer 120 includes the polycrystalline silicon, the active layer ACT of the transistor TR may include a plurality of doped regions doped with impurities and a channel region between the plurality of doped regions. In one or more embodiments, the semiconductor layer 120 may include an oxide semiconductor. The oxide semiconductor may be, for example, indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO), and/or the like.

A gate insulating film 162 may be on the semiconductor layer 120. The gate insulating film 162 may function as a gate insulating film of the transistor. The gate insulating film 162 may be formed as multiple layers in which inorganic layers including at least one of inorganic materials such as silicon oxide ($SiO_x$), silicon nitride ($SiN_x$), and/or silicon oxynitride ($SiO_xN_y$) are alternately stacked.

The first conductive layer 130 may be on the gate insulating film 162. The first conductive layer 130 may include a gate electrode GE of the transistor TR. The gate electrode GE may overlap the channel region of the active layer ACT in the sixth direction DR6, which is the thickness direction of the substrate SUB.

A first interlayer insulating film 163 may be on the first conductive layer 130. The first interlayer insulating film 163 may cover the gate electrode GE. The first interlayer insulating film 163 may function as an insulating film between the first conductive layer 130 and other layers on the first conductive layer 130, and protect the first conductive layer 130.

The second conductive layer 140 may be on the first interlayer insulating film 163. The second conductive layer 140 may include a drain electrode SD1 of the transistor TR and a source electrode SD2 of the transistor TR.

The drain electrode SD1 and the source electrode SD2 of the transistor TR may be electrically connected (e.g., electrically coupled) to both end areas (e.g., portions) of the active layer ACT of the transistor TR through contacts holes penetrating through the first interlayer insulating film 163 and the gate insulating film 162, respectively. In addition, the source electrode SD2 of the transistor TR may be electrically connected to the light blocking pattern BML of the lower metal layer 110 through another contact hole penetrating through the first interlayer insulating film 163, the gate insulating film 162, and the buffer layer 161.

A second interlayer insulating film 164 may be on the second conductive layer 140. The second interlayer insulating film 164 may cover the drain electrode SD1 of the transistor TR and the source electrode SD2 of the transistor TR. The second interlayer insulating film 164 may function as an insulating film between the second conductive layer 140 and other layers on the second conductive layer 140, and protect the second conductive layer 140.

The third conductive layer 150 may be provided on the second interlayer insulating film 164. The third conductive layer 150 may include a first voltage line VL1, a second voltage line VL2, and a conductive pattern CDP.

The first voltage line VL1 may overlap at least a portion of the drain electrode SD1 of the transistor TR in the thickness direction of the substrate SUB. A high potential voltage (or a first source voltage) supplied to the transistor TR may be applied to the first voltage line VL1.

The second voltage line VL2 may be electrically connected (e.g., electrically coupled) to the second electrode 220 through a second electrode contact hole CTS penetrating through a via layer 166 and a passivation layer 165 to be described in more detail herein below. A low potential voltage (or a second source voltage) lower than the high potential voltage supplied to the first voltage line VL1 may be applied to the second voltage line VL2. For example, the high potential voltage (or the first source voltage) supplied to the transistor TR may be applied to the first voltage line VL1, and the low potential voltage (or the second source voltage) lower than the high potential voltage supplied to the first voltage line VL1 may be applied to the second voltage line VL2.

The conductive pattern CDP may be electrically connected (e.g., electrically coupled) to the source electrode SD2 of the transistor TR. The conductive pattern CDP may be electrically connected to the source electrode SD2 of the transistor TR through a contact hole penetrating through the second interlayer insulating film 164. In addition, the conductive pattern CDP may be electrically connected to the first electrode 210 through a first electrode contact hole CTD penetrating through a via layer 166 and a passivation layer 165 to be described in more detail herein below. The transistor TR may transfer the first source voltage applied from the first voltage line VL1 to the first electrode 210 through the conductive pattern CDP.

The passivation layer 165 may be on the third conductive layer 150. The passivation layer 165 may cover the third conductive layer 150. The passivation layer 165 may serve to protect the third conductive layer 150.

Each of the buffer layer 161, the gate insulating film 162, the first interlayer insulating film 163, the second interlayer insulating film 164, and the passivation layer 165 described above may be formed as a plurality of inorganic layers that are alternately stacked. For example, each of the buffer layer 161, the gate insulating film 162, the first interlayer insulating film 163, the second interlayer insulating film 164, and the passivation layer 165 described above may be formed as a double layer in which inorganic layers including at least one of silicon oxide ($SiO_x$), silicon nitride ($SiN_x$), or silicon oxynitride ($SiO_xN_y$) are stacked, or multiple layers in which these layers are alternately stacked. However, the disclosure is not limited thereto, and each of the buffer layer 161, the gate insulating film 162, the first interlayer insulating film 163, the second interlayer insulating film 164, and the passivation layer 165 described above may also be formed as one inorganic layer including the insulating material described above.

The via layer 166 may be on the passivation layer 165. The via layer 166 may include an organic insulating material, for example, an organic material such as polyimide (PI). The via layer 166 may serve to planarize (or substantially planarize) a surface. Accordingly, an upper surface (or a surface) of the via layer 166 on which a light emitting element layer to be described in more detail herein below is positioned may be a substantially flat surface regardless of a shape or the presence or absence of a pattern below the via layer 166.

The light emitting element layer may be on the circuit element layer. The light emitting element layer may be on the via layer 166. The light emitting element layer may include a first bank 400, an electrode layer 200, a first insulating layer 510, a second bank 600, a plurality of light emitting elements ED and a contact electrode 700.

The first bank 400 may be on the via layer 166 in the emission area EMA. The first bank 400 may be directly on one surface of the via layer 166. The first bank 400 may have a structure in which at least a portion thereof protrudes upward (e.g., toward one side in the sixth direction DR6) with respect to one surface of the via layer 166. The protruding portion of the first bank 400 may have inclined side surfaces. The first bank 400 may have the inclined surfaces and may serve to change a traveling direction of light emitted from the light emitting elements ED and traveling toward the side surfaces of the first bank 400 into an upward direction (e.g., a display direction).

The first bank 400 may include a first sub-bank 410 and a second sub-bank 420 spaced apart from each other. The first sub-bank 410 and the second sub-bank 420 spaced apart from each other may provide a space in which the light emitting elements ED are positioned, and may assist in a role of reflective partition walls changing the traveling direction of the light emitted from the light emitting elements ED into the display direction.

It has been illustrated in the drawings that the side surfaces of the first bank 400 are in a linear inclined shape, but the disclosure is not limited thereto. For example, the side surfaces (or outer surfaces) of the first bank 400 may have a curved semicircular or semielliptical shape. In one or more embodiments, the first bank 400 may include an organic insulating material such as polyimide (PI), but is not limited thereto.

The electrode layer 200 may have a shape extending in one direction and may cross the emission area EMA and the sub-area SA. The electrode layer 200 may transfer electrical signals applied from the circuit element layer to the light emitting elements ED in order for the light emitting elements ED to emit light. In addition, the electrode layer 200 may be used to generate an electric field used in a process of aligning the plurality of light emitting elements ED.

The electrode layer 200 may be positioned on the first bank 400 and the via layer 166 exposed by the first bank 400. The electrode layer 200 may be on the first bank 400 in the emission area EMA, and may be on the via layer 166 exposed by the first bank 400 in the non-emission area.

The electrode layer 200 may include a first electrode 210 and a second electrode 220. The first electrode 210 and the second electrode 220 may be spaced apart from each other.

The first electrode 210 may be on the left side of each pixel PX in a plan view. The first electrode 210 may have a shape extending in the fifth direction DR5 in a plan view. The first electrode 210 may cross the emission area EMA and the sub-area SA. The first electrode 210 may extend in the fifth direction DR5 in a plan view, but may be separated from a first electrode 210 of a pixel PX neighboring (e.g., adjacent) in the fifth direction DR5 in the separation part ROP of the sub-area SA.

The second electrode 220 may be spaced apart from the first electrode 210 in the fourth direction DR4. The second electrode 220 may be on the right side of each pixel PX in a plan view. The second electrode 220 may have a shape extending in the fifth direction DR5 in a plan view. The second electrode 220 may cross the emission area EMA and the sub-area SA. The second electrode 220 may extend in the fifth direction DR5 in a plan view, but may be separated from a second electrode 220 of a pixel PX neighboring (e.g., adjacent) in the fifth direction DR5 in the separation part ROP of the sub-area SA.

For example, in the emission area EMA, the first electrode 210 may be on the first sub-bank 410, and the second electrode 220 may be on the second sub-bank 420. The first electrode 210 may extend outward from the first sub-bank 410 to also be on the via layer 166 exposed (e.g., not covered) by the first sub-bank 410. Similarly, the second electrode 220 may extend outward from the second sub-bank 420 to also be on the via layer 166 exposed (e.g., not covered) by the second sub-bank 420. The first electrode 210 and the second electrode 220 may be spaced apart from and face each other in a spaced area between the first sub-bank 410 and the second sub-bank 420. The via layer 166 may be exposed in an area where the first electrode 210 and the second electrode 220 are spaced apart from and face each other.

The first electrode 210 may be spaced apart from a first electrode 210 of another pixel PX adjacent in the fifth direction DR5 with the separation part ROP interposed therebetween in the sub-area SA. Similarly, the second electrode 220 may be spaced apart from a second electrode 220 of another pixel PX adjacent in the fifth direction DR5 with the separation part ROP interposed therebetween in the sub-area SA. Accordingly, the first electrode 210 and the second electrode 220 may expose the via layer 166 in the separation part ROP of the sub-area SA.

The first electrode 210 may be electrically connected (e.g., electrically coupled) to the conductive pattern CDP of the circuit element layer through the first electrode contact hole CTD penetrating through the via layer 166 and the passivation layer 165. For example, the first electrode 210 may be in contact with an upper surface of the conductive pattern CDP exposed by the first electrode contact hole CTD. The first source voltage applied from the first voltage line VL1 may be transferred to the first electrode 210 through the conductive pattern CDP.

The second electrode 220 may be electrically connected (e.g., electrically coupled) to the second voltage line VL2 of the circuit element layer through the second electrode contact hole CTS penetrating through the via layer 166 and the passivation layer 165. For example, the second electrode 220 may be in contact with an upper surface of the second voltage line VL2 exposed by the second electrode contact hole CTS. The second source voltage applied from the second voltage line VL2 may be transferred to the second electrode 220.

The electrode layer 200 may include a conductive material having high reflectivity. For example, the electrode layer 200 may include a metal such as silver (Ag), copper (Cu), and/or aluminum (Al), or may include an alloy including aluminum (Al), nickel (Ni), lanthanum (La), and/or the like, as the material having the high reflectivity. The electrode layer 200 may reflect the light emitted from the light emitting elements ED and traveling toward the side surfaces of the first bank 400 in the upward direction of each pixel PX.

However, the disclosure is not limited thereto, and the electrode layer 200 may further include a transparent conductive material. For example, the electrode layer 200 may include a material such as ITO, IZO, and/or ITZO. In some embodiments, the electrode layer 200 may have a structure in which one or more layers made of the transparent conductive material and one or more layers made of the metal having high reflectivity are stacked, or may be formed as one layer including the transparent conductive material and the metal having high reflectivity. For example, the electrode layer 200 may have a stacked structure such as ITO/Ag/ITO, ITO/Ag/IZO, or ITO/Ag/ITZO/IZO.

The first insulating layer 510 may be on the via layer 166 on which the electrode layer 200 is formed. The first insulating layer 510 may protect the electrode layer 200 and insulate the first electrode 210 and the second electrode 220 from each other.

The first insulating layer 510 may include an inorganic insulating material. For example, the first insulating layer 510 may include at least one of inorganic insulating materials such as silicon oxide ($SiO_x$), silicon nitride ($SiN_x$), silicon oxynitride ($SiO_xN_y$), aluminum oxide ($Al_xO_y$), and/or aluminum nitride (AlN). The first insulating layer 510 made of the inorganic insulating material may have a surface shape reflecting (e.g., corresponding to) a pattern shape of the electrode layer 200 positioned therebelow. For example, the first insulating layer 510 may have a step structure according to a shape of the electrode layer 200 below the first insulating layer 510. For example, the first insulating layer 510 may include a step structure in which a portion of an upper surface thereof is recessed in an area where the first electrode 210 and the second electrode 220 are spaced apart from and face each other. Accordingly, a height of an upper surface of the first insulating layer 510 (e.g., a distance from an upper surface of the via layer 166 to an upper surface of the first insulating layer 510) positioned on an upper portion of the first electrode 210 and an upper portion of the second electrode 220 may be greater than a height of an upper surface of the first insulating layer 510 positioned on an upper portion of the via layer 166 on which the first electrode 210 and the second electrode 220 are not provided. In the specification, a relative comparison of a height of an upper surface of any layer may be made by a height measured from a flat reference surface (e.g., an upper surface of the via layer 166) that does not have a lower step structure.

The first insulating layer 510 may include a first contact part CT1 exposing a portion of an upper surface of the first electrode 210 in the sub-area SA, and a second contact part CT2 exposing a portion of an upper surface of the second electrode 220 in the sub-area SA. The first electrode 210 may be electrically connected (e.g., electrically coupled) to a first contact electrode 710 to be described in more detail herein below through a first contact portion CT1 penetrating through the first insulating layer 510 in the sub-area SA, and the second electrode 220 may be electrically connected to a second contact electrode 720 to be described in more detail herein below through a second contact portion CT2 penetrating through the first insulating layer 510 in the sub-area SA.

The second bank 600 may be on the first insulating layer 510. The second bank 600 may be formed in a lattice pattern by including portions extending in the fourth direction DR4 and the fifth direction DR5 in a plan view.

The second bank 600 may extend across boundaries between the respective pixels PX to divide neighboring pixels PX, and may divide the emission area EMA and the sub-area SA. In addition, the second bank 600 may be formed to have a greater height than that of the first bank 400, to prevent or reduce the mixing of ink in which the plurality of light emitting elements ED are dispersed in adjacent pixels PX, and to facilitate the jetting of the ink into the emission area EMA in an inkjet printing process for aligning the light emitting elements ED during the manufacturing the display device 10.

The plurality of light emitting elements ED may be provided in the emission area EMA. The plurality of light emitting elements ED may not be provided in the sub-area SA.

The plurality of light emitting elements ED may be positioned on the first insulating layer 510 between the first sub-bank 410 and the second sub-bank 420. The plurality of light emitting elements ED may be positioned between the first electrode 210 and the second electrode 220 on the first insulating layer 510.

The light emitting elements ED may have a shape extending in one direction, and may be arranged so that both ends thereof are placed on the first electrode 210 and the second electrode 220, respectively. For example, the plurality of light emitting elements ED may be arranged so that one (e.g., first) ends thereof are placed on the first electrode 210 and the other (e.g., second) ends thereof are placed on the second electrode 220.

A length of each light emitting element ED (i.e., a length of the light emitting element ED in the fourth direction DR4 in FIGS. 19 and 20) may be smaller than the shortest interval between the first sub-bank 410 and the second sub-bank 420 spaced apart from each other in the fourth direction DR4. In addition, the length of each light emitting element ED may be greater than the shortest distance between the first electrode 210 and the second electrode 220 spaced apart from each other in the fourth direction DR4. Because an interval between the first sub-bank 410 and the second sub-bank 420 in the fourth direction DR4 is greater than the length of each light emitting element ED and an interval between the first electrode 210 and the second electrode 220 in the fourth direction DR4 is smaller than the length of each light emitting element ED, the plurality of light emitting elements ED may be positioned in an area between the first sub-bank 410 and the second sub-bank 420 so that both ends thereof are placed on the first electrode 210 and the second electrode 220, respectively.

The plurality of light emitting elements ED may be spaced apart from each other along the fifth direction DR5 in which the first electrode 210 and the second electrode 220 extend, and may be aligned substantially parallel to each other.

A second insulating layer 520 may be provided on the light emitting elements ED. The second insulating layer 520 may be partially on the light emitting elements ED so as to expose both ends of the light emitting elements ED. The second insulating layer 520 may partially surround outer surfaces of the light emitting elements ED, and may be positioned so as not to cover one (e.g., first) ends and the other (e.g., second) ends of the light emitting elements ED.

Portions of the second insulating layer 520 on the light emitting elements ED may extend in the fifth direction DR5 on the first insulating layer 510 in a plan view to form a linear or island-shaped pattern in each pixel PX. The second insulating layer 520 may protect the light emitting elements ED and fix (e.g., affix) the light emitting elements ED in the processes of manufacturing the display device 10. In addition, the second insulating layer 520 may fill spaces between the light emitting elements ED and the first insulating layer 510 below the light emitting elements ED.

The contact electrode 700 may be positioned on the second insulating layer 520. The contact electrode 700 may be positioned on the first insulating layer 510 on which the light emitting elements ED are positioned. The contact electrode 700 may include a first contact electrode 710 and a second contact electrode 720 spaced apart from each other.

The first contact electrode 710 may be on the first electrode 210 in the emission area EMA. The first contact electrode 710 may have a shape extending in the fifth direction DR5 on the first electrode 210. The first contact electrode 710 may be in contact with each of the first electrode 210 and one (e.g., first) end of the light emitting element ED.

The first contact electrode 710 may be in contact with the first electrode 210 exposed by the first contact part CT1 penetrating through the first insulating layer 510 in the sub-area SA, and be in contact with one (e.g., first) end of the light emitting element ED in the emission area EMA. For example, the first contact electrode 710 may serve to electrically connect (e.g., electrically couple) the first electrode 210 and the one (e.g., first) end of the light emitting element ED to each other.

The second contact electrode 720 may be on the second electrode 220 in the emission area EMA. The second contact electrode 720 may have a shape extending in the fifth direction DR5 on the second electrode 220. The second contact electrode 720 may be in contact with each of the second electrode 220 and the other (e.g., second) end of the light emitting element ED.

The second contact electrode 720 may be in contact with the second electrode 220 exposed by the second contact part CT2 penetrating through the first insulating layer 510 in the sub-area SA, and be in contact with the other (e.g., second) end of the light emitting element ED in the emission area EMA. For example, the second contact electrode 720 may serve to electrically connect (e.g., electrically couple) the second electrode 220 and the other (e.g., second) end of the light emitting element ED to each other.

The first contact electrode 710 and the second contact electrode 720 may be spaced apart from each other on the light emitting element ED. For example, the first contact electrode 710 and the second contact electrode 720 may be spaced apart from each other with the second insulating layer 520 interposed therebetween. The first contact electrode 710 and the second contact electrode 720 may be electrically insulated from each other.

The first contact electrode 710 and the second contact electrode 720 may include the same material. For example, each of the first contact electrode 710 and the second contact electrode 720 may include a conductive material. For example, the first contact electrode 710 and the second contact electrode 720 may include ITO, IZO, ITZO, aluminum (Al), and/or the like. As an example, each of the first contact electrode 710 and the second contact electrode 720 may include a transparent conductive material. Because each of the first contact electrode 710 and the second contact electrode 720 includes the transparent conductive material, the light emitted from the light emitting elements ED may be transmitted through the first contact electrode 710 and the second contact electrode 720, and then travel toward the first electrode 210 and the second electrode 220, and may be reflected from surfaces of the first electrode 210 and the second electrode 220.

The first contact electrode 710 and the second contact electrode 720 may include the same material and may be formed as the same layer. The first contact electrode 710 and the second contact electrode 720 may be simultaneously (e.g., concurrently) formed through the same process.

A third insulating layer 530 may be provided on the contact electrode 700. The third insulating layer 530 may cover the light emitting element layer therebelow. The third insulating layer 530 may cover the first bank 400, the electrode layer 200, the first insulating layer 510, the plurality of light emitting elements ED, and the contact electrode 700. The third insulating layer 530 may be positioned on the second bank 600 to also cover the second bank 600.

The third insulating layer 530 may serve to protect the light emitting element layer therebelow from foreign materials such as moisture/oxygen and/or dust particles. The third insulating layer 530 may serve to protect the first bank 400, the electrode layer 200, the first insulating layer 510, the plurality of light emitting elements ED, and the contact electrode 700.

Figure 21:
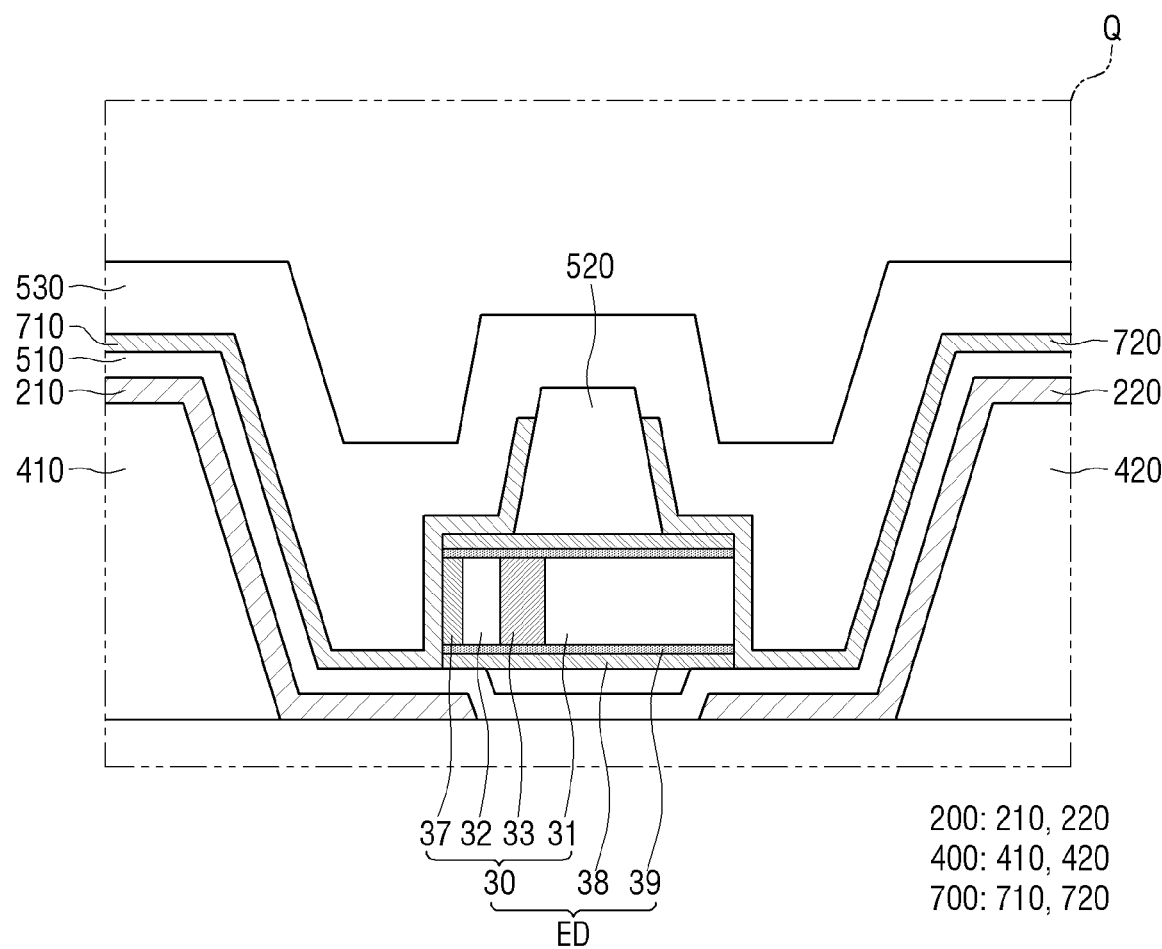
FIG. 21 is an enlarged cross-sectional view of one or more embodiments of region Q of FIG. 20.

FIG. 21 is an enlarged cross-sectional view illustrating one or more embodiments of region Q of FIG. 20.

Referring to FIG. 21, the light emitting element ED may be placed so that an extension direction of the light emitting element ED is parallel (or substantially parallel) to one surface of the substrate SUB. The plurality of semiconductor layers included in the light emitting element ED may be sequentially stacked along a direction parallel (or substantially parallel) to an upper surface of the substrate SUB (or an upper surface of the via layer 166). For example, the first semiconductor layer 31, the light emitting layer 33, and the second semiconductor layer 32 of the light emitting element ED may be sequentially stacked to be parallel (or substantially parallel) to the upper surface of the substrate SUB.

For example, in the light emitting element ED, in a cross section crossing both ends of the light emitting element ED, the first semiconductor layer 31, the light emitting layer 33, the second semiconductor layer 32, and the element electrode layer 37 may be sequentially formed in a direction horizontal to the upper surface of the substrate SUB.

The light emitting element ED may be arranged so that one (e.g., first) end thereof is placed on the first electrode 210 and the other (e.g., second) end thereof is placed on the second electrode 220. However, the disclosure is not limited thereto, and the light emitting element ED may also be arranged so that one end thereof is placed on the second electrode 220 and the other end thereof is placed on the first electrode 210.

The second insulating layer 520 may be positioned on the light emitting element ED. The second insulating layer 520 may surround (e.g., at least partially cover) an outer surface of the light emitting element ED. The second insulating layer 520 may be on the second element insulating layer 38 of the light emitting element ED, and may surround (e.g., at least partially cover) an outer surface of the second element insulating layer 38 of the light emitting element ED facing the display direction DR6.

In an area in which the light emitting element ED is positioned, the second insulating layer 520 may surround (e.g., at least partially cover) the outer surface of the light emitting element ED (for example, the second element insulating layer 38 of the light emitting element ED).

The first contact electrode 710 may be in contact with one (e.g., first) end of the light emitting element ED exposed by the second insulating layer 520. For example, the first contact electrode 710 may surround (e.g., at least partially cover) one end surface of the light emitting element ED exposed by the second insulating layer 520. The first contact electrode 710 may be in contact with the second element insulating layer 38 and the element electrode layer 37 of the light emitting element ED.

The second contact electrode 720 may be in contact with the other (e.g., second) end of the light emitting element ED exposed by the second insulating layer 520. For example, the second contact electrode 720 may surround (e.g., at least partially cover) the other end surface of the light emitting element ED exposed by the second insulating layer 520. The second contact electrode 720 may be in contact with the second element insulating layer 38 and the first semiconductor layer 31 of the light emitting element ED.

The first contact electrode 710 and the second contact electrode 720 may be spaced apart from each other with the second insulating layer 520 interposed therebetween. The first contact electrode 710 and the second contact electrode 720 may expose at least a portion of an upper surface of the second insulating layer 520.

The first contact electrode 710 and the second contact electrode 720 may be formed on the same layer and may include the same material. For example, the first contact electrode 710 and the second contact electrode 720 may be simultaneously (e.g., concurrently) formed through one mask process. Accordingly, an additional mask process for forming the first contact electrode 710 and the second contact electrode 720 is not required, and thus, efficiency of the processes of manufacturing the display device 10 may be improved.

Figure 22:
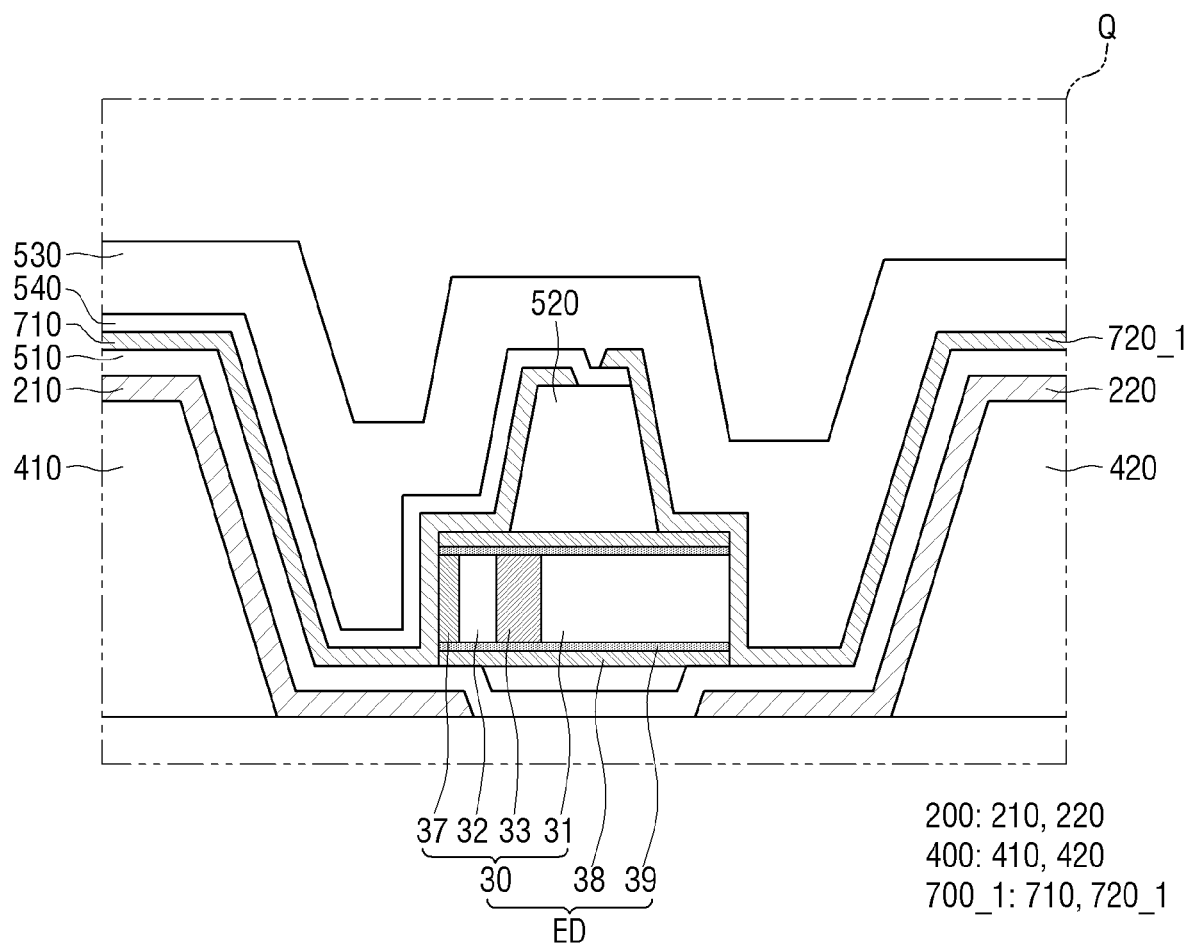
FIG. 22 is an enlarged cross-sectional view of one or more other embodiments of region Q of FIG. 20.

FIG. 22 is an enlarged cross-sectional view illustrating one or more other embodiments of region Q of FIG. 20.

Referring to FIG. 22, a display device 10 according to the embodiments is different from the display device 10 according to the embodiments described above with reference to FIG. 21 in that a contact electrode 700_1 includes a first contact electrode 710 and a second contact electrode 720_1 formed on different layers, and a fourth insulating layer 540 is further included.

For example, the contact electrode 700_1 may include the first contact electrode 710 and the second contact electrode 720_1 formed on the different layers.

The first contact electrode 710 may be on the first electrode 210 and one (e.g., first) end of the light emitting element ED. The first contact electrode 710 may extend from the one end of the light emitting element ED toward the second insulating layer 520 to also be on one sidewall of the second insulating layer 520 and an upper surface of the second insulating layer 520. The first contact electrode 710 may be on the upper surface of the second insulating layer 520, but may expose at least a portion of the upper surface of the second insulating layer 520.

The fourth insulating layer 540 may be provided on the first contact electrode 710. The fourth insulating layer 540 may completely (e.g., entirely) cover the first contact electrode 710. The fourth insulating layer 540 may completely (e.g., entirely) cover one sidewall and the upper surface of the second insulating layer 520, but may not be on the other sidewall of the second insulating layer 520. One end of the fourth insulating layer 540 may be aligned with the other sidewall of the second insulating layer 520.

The second contact electrode 720_1 may be on the second electrode 220 and the other (e.g., second) end of the light emitting element ED. The second contact electrode 720_1 may extend from the other end of the light emitting element ED toward the second insulating layer 520 to also be on the other sidewall of the second insulating layer 520 and an upper surface of the fourth insulating layer 540.

The third insulating layer 530 may be on the fourth insulating layer 540 and the second contact electrode 720_1. The third insulating layer 530 may be on the fourth insulating layer 540 and the second contact electrode 720_1 to cover the fourth insulating layer 540 and the second contact electrode 720_1.

In the embodiments, a process (e.g., an act or step) is added to the manufacturing process of the display device 10 by forming the first contact electrode 710 and the second contact electrode 720_1 on the different layers and interposing the fourth insulating layer 540 between the first contact electrode 710 and the second contact electrode 720_1, such that manufacturing process efficiency of the display device 10 may be decreased, but reliability of the display device 10 may be improved. For example, a risk of a short-circuit between the first contact electrode 710 and the second contact electrode 720_1 during the processes of manufacturing the display device 10 may be minimized or reduced by forming the first contact electrode 710 and the second contact electrode 720_1 on the different layers, and further disposing the fourth insulating layer 540 between the first contact electrode 710 and the second contact electrode 720_1.

Figure 23:
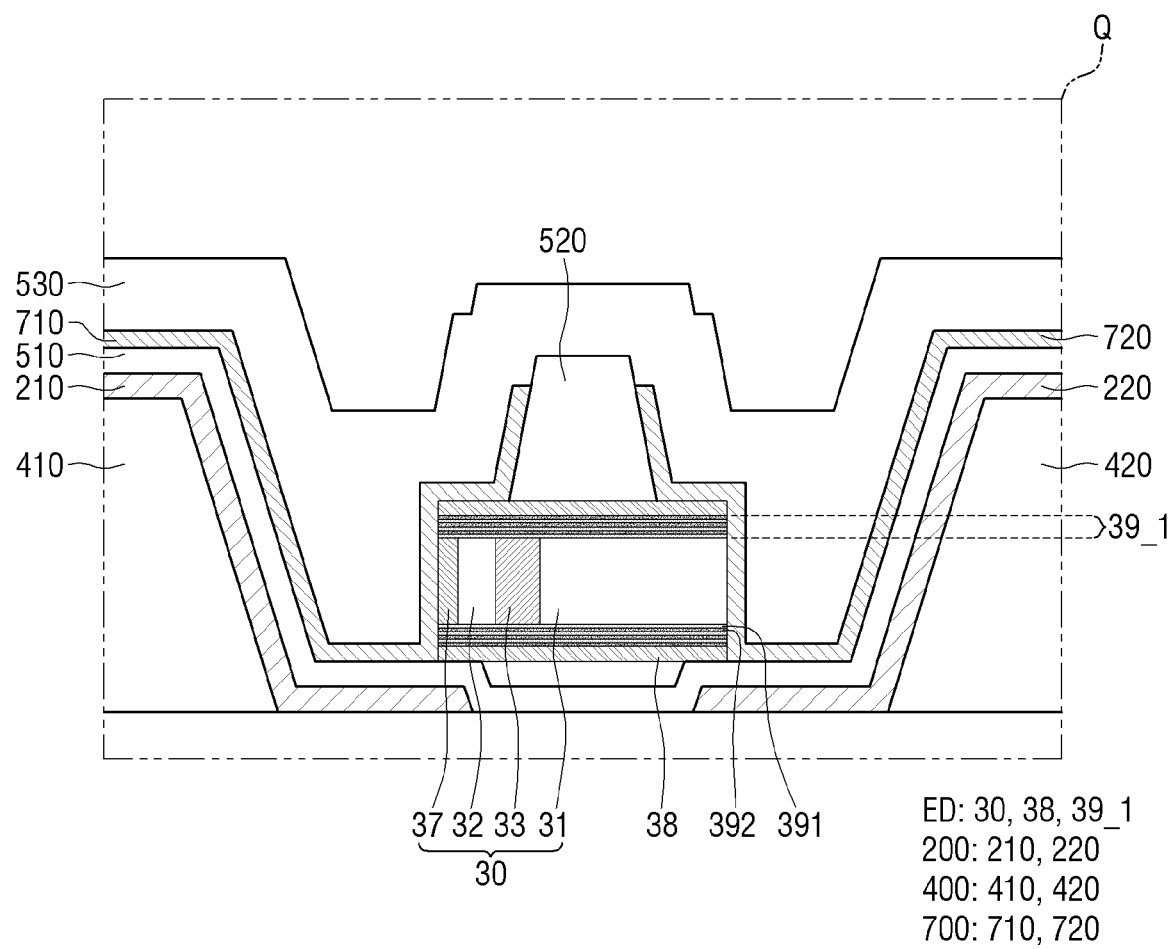
FIG. 23 is an enlarged cross-sectional view of one or more other embodiments of region Q of FIG. 20.

FIG. 23 is an enlarged cross-sectional view illustrating one or more other embodiments of region Q of FIG. 20.

Referring to FIG. 23, a display device 10 according to the embodiments is different from the display device 10 according to the embodiments described above with reference to FIG. 21 in that it includes the light emitting element according to the embodiments of FIG. 5.

For example, the light emitting element according to the embodiments of FIG. 5 may include a first element insulating layer 39_1 having a superlattice structure, and in the light emitting element ED on the first electrode 210 and the second electrode 220, a first element insulating layer 39_1, in which a plurality of first layers 391 and second layers 392 are alternately and repeatedly stacked, may be interposed between the light emitting element core 30 and the second element insulating layer 38.

Figure 24:
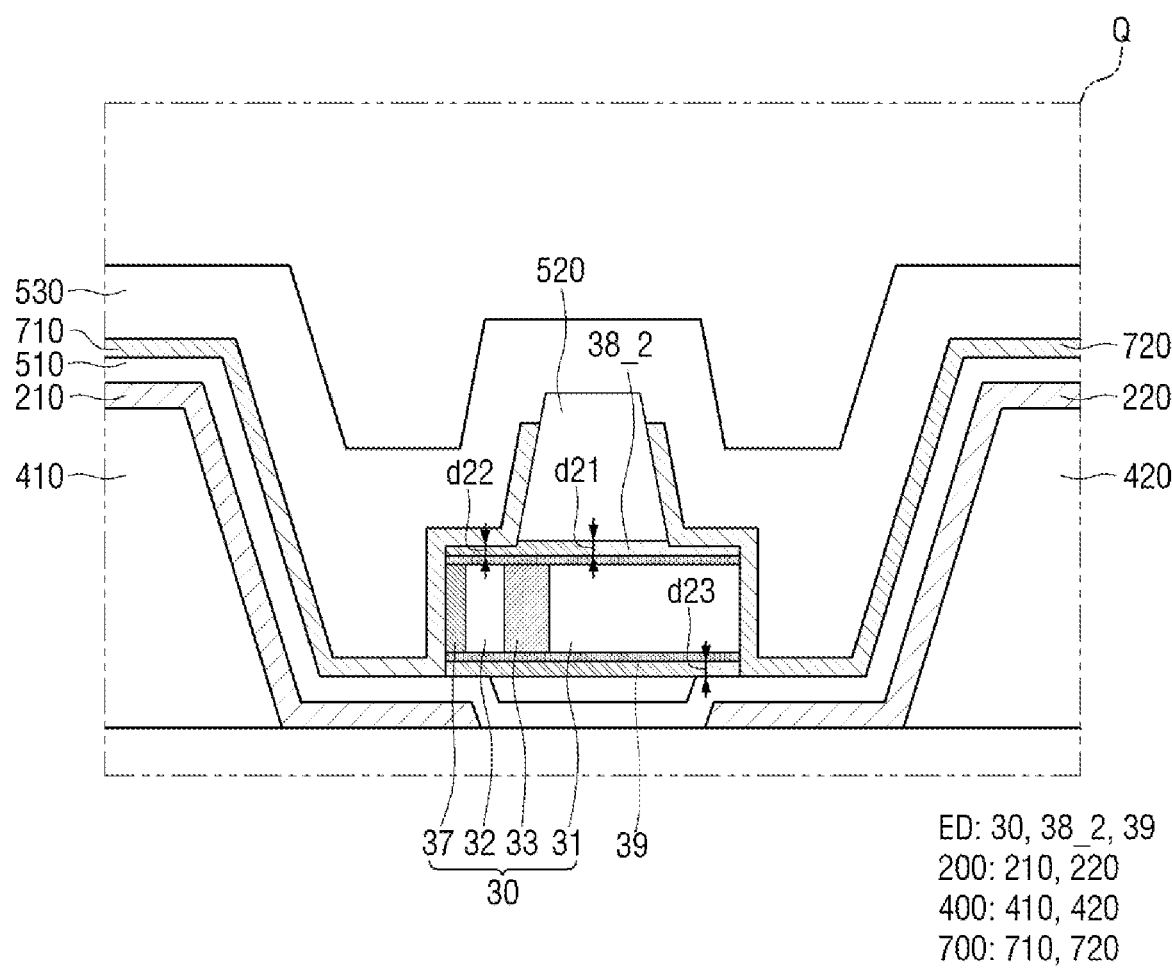
FIG. 24 is an enlarged cross-sectional view of one or more other embodiments of region Q of FIG. 20.

FIG. 24 is an enlarged cross-sectional view illustrating one or more other embodiments of region Q of FIG. 20.

Referring to FIG. 24, a display device 10 according to the embodiments is different from the display device 10 according to the embodiments described above with reference to FIG. 21 in that a thickness of a second element insulating layer 38_2 of the light emitting element ED facing a display direction is different for each area.

For example, the second element insulating layer 38_2 of the light emitting element ED aligned between the first electrode 210 and the second electrode 220 may have a different thickness for different areas. The second element insulating layer 38_2 positioned above the light emitting element core 30 in a cross section crossing the light emitting element ED (e.g., in a direction substantially perpendicular to the extension direction of the light emitting element ED) may have a first thickness d21 in an area overlapping with the second insulating layer 520, and the second element insulating layer 38_2 positioned above the light emitting element core 30 in the cross section crossing the light emitting element ED in an area that does not overlap the second insulating layer 520 may have a second thickness d22 smaller than the first thickness d21. The second element insulating layer 38_2 positioned below the light emitting element core 30 in the cross section crossing the light emitting element ED may have a third thickness d23 equal to the first thickness d21. A portion of the second element insulating layer 38_2 positioned above the light emitting element core 30 may face the display direction, and another portion of the second element insulating layer 38_2 positioned below the light emitting element core 30 may face the first insulating layer 510.

For example, the second element insulating layer 38_2 overlapping the second insulating layer 520 and positioned above the light emitting element core 30, and the second element insulating layer 38_2 positioned below the light emitting element core 30, may have the same thickness, and the second element insulating layer 38_2 that does not overlap the second insulating layer 520 and is positioned above the light emitting element core 30 may have a thickness smaller than that of the second element insulating layer 38_2 overlapping the second insulating layer 520 and positioned above the light emitting element core 30. This may be formed by etching a portion of the second element insulating layer 38_2 in the processes of manufacturing the display device 10.

In concluding the detailed description, those skilled in the art will appreciate that many variations and modifications can be made to the present embodiments without substantially departing from the principles of the present disclosure as set forth in the following claims and their equivalents. Therefore, the disclosed embodiments of the present disclosure are used in a generic and descriptive sense only and not for purposes of limitation.

What is claimed is:

1. A light emitting element comprising:
a light emitting element core comprising a first semiconductor layer, a second semiconductor layer, and a light emitting layer between the first semiconductor layer and the second semiconductor layer;
a single crystal insulating layer on a side surface of the light emitting element core; and
an element insulating layer on an outer surface of the single crystal insulating layer.

2. The light emitting element of claim 1, wherein the element insulating layer comprises a first element insulating film on the outer surface of the single crystal insulating layer and a second element insulating film on an outer surface of the first element insulating film.

3. The light emitting element of claim 1, wherein the single crystal insulating layer has a superlattice structure in which first layers and second layers comprising different materials are alternately stacked, and
the first layers and the second layers are stacked in a direction substantially perpendicular to the side surface of the light emitting element core.

4. The light emitting element of claim 3, wherein each of the first layers and the second layers is a single crystal insulating film.

5. The light emitting element of claim 4, wherein each of the first layers and the second layers has a thickness equal to or less than a critical thickness.

6. The light emitting element of claim 5, wherein each of the first layers and the second layers has a thickness greater than 0 and equal to or less than 5 nm.

7. The light emitting element of claim 3, wherein a first layer of the first layers comprises a first compound semiconductor, and
a second layer of the second layers comprises a second compound semiconductor different from the first compound semiconductor.

8. The light emitting element of claim 7, wherein each of the first compound semiconductor and the second compound semiconductor comprises a group III-V semiconductor compound.

9. The light emitting element of claim 8, wherein the first compound semiconductor has a chemical formula of AB, wherein A is a group III element and B is a group V element, and
the second compound semiconductor has a chemical formula of $A_xC_{1-x}B$, wherein $0 \leq x < 1$, A and C are group III elements, and B is a group V element.

10. The light emitting element of claim 1, wherein the single crystal insulating layer is directly on the side surface of the light emitting element core, and
the side surface of the light emitting element core comprises at least one of a side surface of the first semiconductor layer, a side surface of the second semiconductor layer, or a side surface of the light emitting layer.

11. A light emitting element comprising:
a light emitting element core comprising a first semiconductor layer, a second semiconductor layer, and a light emitting layer between the first semiconductor layer and the second semiconductor layer; and
a first element insulating layer on a side surface of the light emitting element core,
wherein the first element insulating layer has a superlattice structure in which first layers comprising a first compound semiconductor and second layers comprising a second compound semiconductor different from the first compound semiconductor are alternately stacked.

12. The light emitting element of claim 11, wherein each of the first compound semiconductor and the second compound semiconductor comprises a group III-V semiconductor compound.

13. The light emitting element of claim 12, wherein the first compound semiconductor has a chemical formula of AB, wherein A is a group III element and B is a group V element, and
the second compound semiconductor has a chemical formula of $A_xC_{1-x}B$, wherein $0 \leq x < 1$, A and C are group III elements, and B is a group V element.

14. The light emitting element of claim 11, wherein each of the first layers and the second layers is a single crystal layer.

15. The light emitting element of claim 14, wherein each of the first layers and the second layers has a thickness greater than 0 and equal to or less than 5 nm.

16. The light emitting element of claim 11, further comprising a second element insulating layer on the first element insulating layer.

17. The light emitting element of claim 16, wherein the second element insulating layer comprises a first element insulating film on an outer surface of the first element insulating layer and a second element insulating film on an outer surface of the first element insulating film.

18. The light emitting element of claim 11, further comprising a first element insulating film on the side surface of the light emitting element core; and
a second element insulating film on an outer surface of the first element insulating layer,
wherein the first element insulating layer is between the first element insulating film and the second element insulating film.

19. A display device comprising:
a first electrode and a second electrode spaced apart from each other on a substrate; and
a light emitting element between the first electrode and the second electrode,
wherein the light emitting element comprises:
a light emitting element core comprising a first semiconductor layer,
a second semiconductor layer, and
a light emitting layer between the first semiconductor layer and the second semiconductor layer; and
a single crystal insulating layer on a side surface of the light emitting element core; and
an element insulating layer on an outer surface of the single crystal insulating layer.

20. The display device of claim 19, wherein the single crystal insulating layer has a superlattice structure in which first layers and second layers comprising different materials are alternately stacked, and
the first layers and the second layers are stacked in a direction substantially perpendicular to the side surface of the light emitting element core.

21. The display device of claim 20, wherein a first layer of the first layers comprises a first compound semiconductor, and a second layer of the second layers comprises a second compound semiconductor different from the first compound semiconductor.

22. The display device of claim 20, wherein each of the first layers and the second layers is a single crystal insulating film.

23. A display device comprising:
a first electrode and a second electrode on a substrate and spaced apart from each other; and
a light emitting element between the first electrode and the second electrode,
wherein the light emitting element comprises:
a light emitting element core comprising a first semiconductor layer, a second semiconductor layer, and a light emitting layer between the first semiconductor layer and the second semiconductor layer; and a first element insulating layer on a side surface of the light emitting element core, and
the first element insulating layer has a superlattice structure in which first layers comprising a first compound semiconductor and second layers comprising a second compound semiconductor different from the first compound semiconductor are alternately stacked.

24. The display device of claim 23, wherein each of the first compound semiconductor and the second compound semiconductor comprises a group III-V semiconductor compound.

25. The display device of claim 24, wherein first compound semiconductor has a chemical formula of AB, wherein A is a group III element and B is a group V element, and
the second compound semiconductor has a chemical formula of $A_xC_{1-x}B$, wherein $0 \leq x < 1$, A and C are group III elements, and B is a group V element.

26. The display device of claim 23, wherein each of the first layers and the second layers is a single crystal layer.

* * * * *